US011328903B2

(12) United States Patent
Jeong et al.

(10) Patent No.: US 11,328,903 B2
(45) Date of Patent: May 10, 2022

(54) PLASMA PROCESSING SYSTEM, METHOD OF CONTROLLING PLASMA IN THE PLASMA PROCESSING SYSTEM, AND METHOD OF MANUFACTURING SEMICONDUCTOR DEVICE BY USING THE METHOD OF CONTROLLING THE PLASMA

(71) Applicant: SAMSUNG ELECTRONICS CO., LTD., Suwon-si (KR)

(72) Inventors: Jaewon Jeong, Hwaseong-si (KR); Daebeom Lee, Chungcheongbuk-do (KR); Juho Lee, Suwon-si (KR); Junghyun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/099,156

(22) Filed: Nov. 16, 2020

(65) Prior Publication Data

US 2021/0351011 A1    Nov. 11, 2021

(30) Foreign Application Priority Data

May 7, 2020   (KR) .................. 10-2020-0054781

(51) Int. Cl.
*H01J 37/32*    (2006.01)
*H01L 21/3065*    (2006.01)

(52) U.S. Cl.
CPC .. *H01J 37/32183* (2013.01); *H01J 37/32568* (2013.01); *H01L 21/3065* (2013.01)

(58) Field of Classification Search
CPC ........... H01J 37/32183; H01J 37/32302; H01J 37/3222; H01J 37/32568; H01L 21/3065

USPC ....... 438/706, 710, 712, 714, 717, 719, 711; 156/345.44, 345.47, 345.48
See application file for complete search history.

(56) References Cited

U.S. PATENT DOCUMENTS

| 6,110,287 | A  | 8/2000 | Arai et al. |
| 7,625,460 | B2 | 12/2009 | Howard |
| 7,658,969 | B2 | 2/2010 | Kumar et al. |
| 7,838,430 | B2 | 11/2010 | Shannon et al. |
| 8,642,478 | B2 | 2/2014 | Ooya et al. |

(Continued)

FOREIGN PATENT DOCUMENTS

| KR | 10-1115439 B1 | 4/2012 |
| KR | 10-1183142 B1 | 9/2012 |
| KR | 10-2016-0072786 A | 6/2016 |

*Primary Examiner* — Lan Vinh
(74) *Attorney, Agent, or Firm* — Lee IP Law, PC

(57) ABSTRACT

A plasma processing system includes a radio-frequency (RF) power source unit configured to generate three RF powers; a process chamber to which a process gas supplied and to which the RF powers are applied to generate a plasma; and an impedance matcher between the RF power source unit and the process chamber, the impedance matcher configured to adjust an impedance. The RF power source unit may include a first RF power source connected to a first electrode located in a lower portion of the process chamber to apply a first RF power having a first frequency, a second RF power source connected to the first electrode and to apply a second RF power having a second frequency, and a third RF power source connected to a second electrode located in an upper portion of the process chamber and to apply a third RF power having a third frequency.

12 Claims, 23 Drawing Sheets

(56) References Cited

U.S. PATENT DOCUMENTS

| | | | |
|---|---|---|---|
| 9,536,749 B2 | 1/2017 | Marakhtanov et al. | |
| 2004/0025791 A1 | 2/2004 | Chen et al. | |
| 2009/0294061 A1* | 12/2009 | Shannon | H01J 37/32935 |
| | | | 156/345.24 |
| 2011/0115378 A1* | 5/2011 | Lubomirsky | H01J 37/32357 |
| | | | 315/111.21 |
| 2018/0292756 A1* | 10/2018 | Kong | H01L 21/0337 |

* cited by examiner

| ITEM | 13.56MHz/ 13.56Mhz (Ref.) | | |
|---|---|---|---|
| | #1 | #2 | #3 |
| Map |  |  |  |
| Avg. (DISTRIBUTION) | 1713 Å/min (2.2%) | 1714 Å/min (2.3%) | 1714 Å/min (2.3%) |

PLASMA PROCESSING SYSTEM, METHOD OF CONTROLLING PLASMA IN THE PLASMA PROCESSING SYSTEM, AND METHOD OF MANUFACTURING SEMICONDUCTOR DEVICE BY USING THE METHOD OF CONTROLLING THE PLASMA

CROSS-REFERENCE TO RELATED APPLICATION

Korean Patent Application No. 10-2020-0054781, filed on May 7, 2020, in the Korean Intellectual Property Office, and entitled: "Plasma Processing System, Method of Controlling Plasma in the Plasma Processing System, and Method of Manufacturing Semiconductor Device by Using the Method of Controlling the Plasma," is incorporated by reference herein in its entirety.

BACKGROUND

1. Field

Embodiments relate to a plasma processing system, a method of controlling plasma in the plasma processing system, and a method of manufacturing semiconductor device by using the method of controlling the plasma.

2. Description of the Related Art

In general, to manufacture semiconductor devices, a series of processes, such as deposition, etching, and cleaning, may be performed. The series of processes may be performed using a deposition, etching, or cleaning apparatus including a process chamber. To improve selectivity and minimize damage to films, a plasma technique, such as a capacitive coupled plasma (CCP) technique, an indicative coupled plasma (ICP) technique, or a combination of CCP and ICP techniques, has been used. Plasma techniques may include a direct plasma technique, in which plasma is directly generated in a process chamber, which is a wafer processing space, and a remote plasma technique, in which plasma is generated outside a process chamber and supplied into the process chamber.

SUMMARY

Embodiments are directed to a plasma processing system, including a radio-frequency (RF) power source unit configured to generate three RF powers having different frequencies; a process chamber to which a process gas for generating plasma is supplied and to which the RF powers are applied to generate a plasma in the process chamber; and an impedance matcher located between the RF power source unit and the process chamber, the impedance matcher being configured to adjust an impedance. The RF power source unit may include a first RF power source connected to a first electrode located in a lower portion of the process chamber and configured to apply a first RF power having a first frequency, a second RF power source connected to the first electrode and configured to apply a second RF power having a second frequency, and a third RF power source connected to a second electrode located in an upper portion of the process chamber and configured to apply a third RF power having a third frequency. The first frequency may be higher than the second and third frequencies, the second frequency may be lower than the first and third frequencies, and the third frequency may be between the first and second frequencies.

Embodiments are also directed to a method of controlling plasma, the method including: primarily supplying a process gas for generating plasma into a process chamber of a plasma processing system; primarily generating, by a radio-frequency (RF) power source unit, three RF powers having different frequencies; primarily generating plasma by applying the primarily generated RF powers to the process chamber; turning off the RF power source unit; secondarily supplying a process gas for generating plasma into the process chamber; secondarily generating, by the RF power source unit, three RF powers having different frequencies; and secondarily generating plasma by applying the secondarily generated RF powers to the process chamber. The RF power may include a first RF power having a first frequency, a second RF power having a second frequency, and a third RF power having a third frequency. The first RF power may be applied through a bottom electrode located in an electrostatic chuck located in a lower portion of the process chamber, the second RF power may be applied through the bottom electrode, the third RF power may be applied through an antenna located in an upper portion of the process chamber, and the first frequency may be higher than the second and third frequencies, the second frequency is lower than the first and third frequencies, and the third frequency is between the first and second frequencies.

Embodiments are also directed to a method of controlling plasma, the method including: supplying a process gas for generating plasma into a process chamber of a plasma processing system; generating, by a radio-frequency (RF) power source unit, three RF powers having different frequencies; and generating plasma by applying the RF powers to the process chamber. The RF powers may include a first RF power having a first frequency, a second RF power having a second frequency, and third RF power having a third frequency, the first and second RF powers may be applied through a bottom electrode located inside an electrostatic chuck located in a lower portion of the process chamber, the third RF power may be applied through an antenna located in an upper portion of the process chamber, and the first frequency may be adjusted to be higher than the second frequency and the third frequency such that a plasma density uniformity in the process chamber is maximized.

Embodiments are also directed to a method of manufacturing a semiconductor device, the method including: supplying a process gas for generating plasma into a process chamber of a plasma processing system; generating, by an RF power source unit, three radio-frequency (RF) powers having different frequencies; generating plasma by applying the RF power to the process chamber; processing a substrate using the plasma, the substrate being located on an electrostatic chuck located in a lower portion of the process chamber; and performing a subsequent semiconductor process on the substrate. The RF powers may include a first RF power having a first frequency, a second RF power having a second frequency, and a third RF power having a third frequency. The first and second RF powers may be applied through a first electrode located inside the electrostatic chuck and the third RF power may be applied through a second electrode located in an upper portion of the process chamber, and the first frequency may be adjusted to be higher than the second frequency and the third frequency such that a plasma density uniformity in the process chamber is maximized.

BRIEF DESCRIPTION OF THE DRAWINGS

Features will become apparent to those of skill in the art by describing in detail example embodiments with reference to the attached drawings in which.

DETAILED DESCRIPTION

Figure 1:
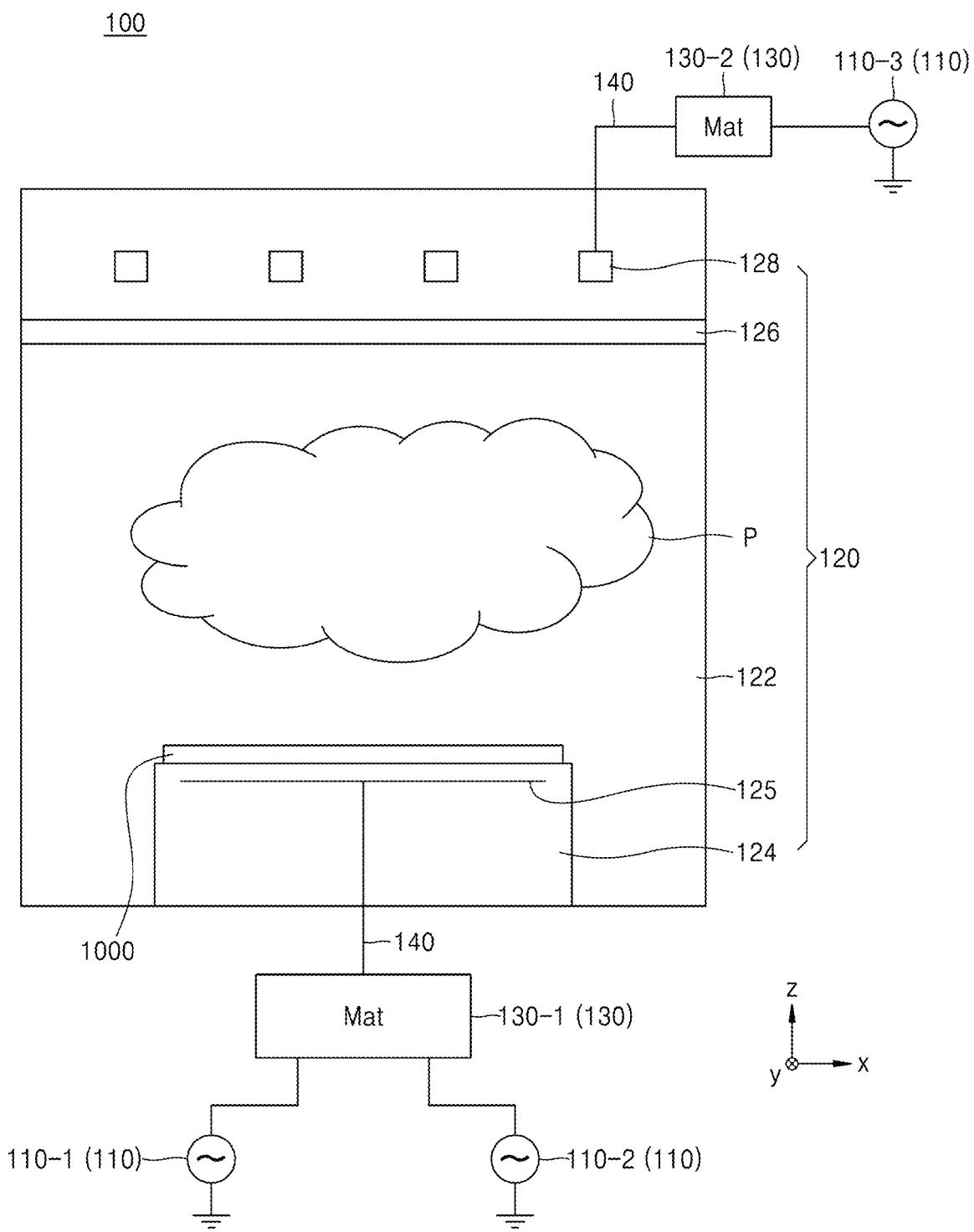
FIG. 1 is a schematic conceptual diagram of a plasma processing system according to an example embodiment.

FIG. 1 is a schematic conceptual diagram of a plasma processing system 100 according to an example embodiment.

Referring to FIG. 1, the plasma processing system 100 according to the present example embodiment may include a radio-frequency (RF) power source unit 110, a process chamber 120, and a impedance matcher 130.

The RF power source unit 110 may include a first RF power source 110-1, a second RF power source 110-2, and a third RF power source 110-3. The first RF power source 110-1 and the second RF power source 110-2 may apply RF powers to the process chamber 120 via a first matcher 130-1 through a bottom electrode 125. The third RF power source 110-3 may apply an RF power to the process chamber 120 via a second matcher 130-2 through an antenna 128. The antenna 128 may correspond to one type of top electrode corresponding to the bottom electrode 125.

The first RF power source 110-1, the second RF power source 110-2, and the third RF power source 110-3 may generate RF powers having respectively different frequencies.

For example, the first RF power source 110-1 may generate a first RF power having a first frequency of several MHz to several tens of MHz, the second RF power source 110-2 may generate a second RF power having a second frequency of several hundred kHz to several MHz, and the third RF power source 110-3 may generate a third RF power having a third frequency of several MHz to several tens of MHz. For example, in the plasma processing system 100 of the present example embodiment, the first RF power of the first RF power source 110-1 may have a first frequency of about 12.88 MHz to about 14.25 MHz. The second RF power of the second RF power source 110-2 may have a second frequency of about 1.8 MHz to about 2.17 MHz. The third RF power of the third RF power source 110-3 may have a third frequency of about 12.88 MHz to about 14.24 MHz. In the plasma processing system 100 of the present example embodiment, to etch a substrate 1000 on which a plasma process is to be performed using plasma P, the first frequency of the first RF power source 110-1 may be about 13.96 MHz, the second frequency of the second RF power source 110-2 may be about 2 MHz, and the third frequency of the third RF power source 110-3 may be about 13.56 MHz. The first frequency of the first RF power source 110-1, the second frequency of the second RF power source 110-2, and the third frequency of the third RF power source 110-3 may be different from the ranges or numerical values described above.

The etching of the substrate 1000 may include the etching of the substrate 1000 including silicon itself or the etching of a material layer (e.g., a polysilicon film, an oxide film, and a nitride film) formed on the substrate 1000.

In the plasma processing system 100 of the present example embodiment, the third RF power of the third RF power source 110-3 may generate plasma P in the process chamber 120. Thus, the third RF power source 110-3 may also be referred to as a plasma power source. The second RF power of the second RF power source 110-2 may supply bias energy to the plasma P in the process chamber 120. Thus, the second RF power source 110-2 may also be referred to as a bias power source. Functions of the first RF power of the first RF power source 110-1 may vary according to an example embodiment. For example, the first RF power may assist and enhance functions of the third RF power of the third RF power source 110-3 and/or the second RF power of the second RF power source 110-2.

When the plasma P is generated in the process chamber 120, radicals and other components such as ions, electrons, and ultraviolet (UV) rays may be generated. At least one of components, such as radicals, ions, electrons, and UV rays, may be used in etching, deposition, and cleaning processes. The radicals may be electrically neutral, while the ions may be electrically polar. When the plasma P is used in an etching process, the radicals may be used to isotropically etch an etching target, while ions may be used to anisotropically etch the etching target. When the second RF power supplies the bias energy to the plasma P as described above, the bias energy may be applied to ions having polarity instead of neutral radicals.

In the plasma processing system 100 of the present example embodiment, when a plasma process is performed, the first to third frequencies of the first to third RF powers may be applied to the process chamber 120 with the following size relationship: the second frequency may be lowest, the first frequency may be highest, and the third frequency may be between the second frequency and the first frequency. Thus, a highest frequency value may be exhibited by the first frequency, followed by the third frequency and finally the second frequency.

In the plasma processing system 100 of the present example embodiment, the first to third RF powers may have respectively different frequencies as applied to the process chamber 120, which may improve a plasma distribution in the process chamber 120 during the plasma process. The plasma distribution may refer to a distribution of plasma densities. By making the first frequency different from the third frequency during the plasma process, a phase-sensitivity issue caused by the use of the same frequency may be avoided. Accordingly, a calibration process for phase synchronization between the first frequency and the third frequency may be omitted. A plasma distribution and phase sensitivity relative to a frequency of an RF power will be described in further detail below with reference to FIGS. 5A to 7.

Each of the first to third RF power sources 110-1, 110-2, and 110-3 of the RF power source unit 110 may generate and output power of several hundred watts (W) to several tens of thousands of watts (W). For example, each of the first to third RF powers of the first to third RF power sources 110-1, 110-2, and 110-3 may range from several kW to several tens of kW. Power generated by each of the first RF power source 110-1, the second RF power source 110-2, and the third RF power source 110-3 may be varied from the numerical values described above. Each of the first to third RF powers may have at least two power levels. When each of the first to third RF powers is applied to the process chamber 120, each of the first to third RF powers may be applied as a continuous wave type or a pulse wave type and time-divided and applied as a time-division type. Power levels, frequency waveforms, and time divisions of the first to third RF powers will be described in further detail below with reference to FIGS. 2 to 4C.

In the plasma processing system 100 of the present example embodiment, the RF power source unit 110 may include the first to third RF power sources 110-1, 110-2, and 110-3, but the number of RF power sources included in the RF power source unit 110 may be varied. For example, the RF power source unit 110 may include two or four or more RF power sources. In the plasma processing system 100 of the present example embodiment, the RF power source unit 110 may correspond to a power source configured to supply power to the process chamber 120, and the process chamber 120 may be regarded as a load that receives power from the RF power source unit 110.

The process chamber 120, which is a chamber for a plasma process, may have plasma P generated therein. In the plasma processing system 100 of the present example embodiment, the process chamber 120 may be an inductively coupled plasma (ICP) chamber. In another example embodiment, the process chamber 120 may be a combination of a capacitively coupled plasma (CCP)-type chamber and an ICP-type chamber. For reference, plasma processing systems may be divided into a CCP type, an ICP type, and a CCP-ICP combination type depending on a type of a process chamber and a type of RF power applied to the process chamber. The plasma processing system 100 of the present example embodiment may be an ICP type. The plasma processing system 100 of the present example embodiment may be a CCP-ICP combination type.

The process chamber 120 may include a chamber body 122, an electrostatic chuck 124, a shower head 126, and an antenna 128.

The chamber body 122 may define a reaction space in which plasma is generated, and hermetically seal the reaction space from the outside. The chamber body 122 may generally include a metal material and be maintained in a ground state to block noise to/from the outside during a plasma process. Although not shown, a gas inlet, a gas outlet, and a view-port may be formed in the chamber body 122. Process gases required for the plasma process may be supplied into the process chamber 120 through the gas inlet. The process gases may refer to all gases (e.g., a source gas, a reactive gas, and a purge gas) used for the plasma process. After the plasma process, gases contained in the process chamber 120 may be exhausted through the gas outlet to the outside. Also, inner pressure of the process chamber 120 may be adjusted by using the gas outlet. At least one view-port may be formed at the chamber body 122, and the inside of the process chamber 120 may be monitored through the at least one view-port.

The electrostatic chuck 124 may be located in a lower portion of the process chamber 120. The substrate 1000 (on which a plasma process is to be performed) may be fixedly located on a top surface of the electrostatic chuck 124. The electrostatic chuck 124 may fix the substrate 1000 using electrostatic force. The substrate 1000 may be a semiconductor substrate including a semiconductor material. For example, the substrate 1000 may include a Group-IV material or a Group III-V compound. The substrate 1000 may include a single-crystalline wafer, such as a single-crystalline silicon wafer, or other various wafers (e.g., an epitaxial (or epi) wafer, a polished wafer, an annealed wafer, and a silicon on insulator (SOI) wafer).

The electrostatic chuck 124 may include the bottom electrode 125 for a plasma process. In the plasma processing system 100 of the present example embodiment, the bottom electrode 125 may be connected to the first RF power source 110-1 and the second RF power source 110-2 via the first matcher 130-1. Thus, the first RF power of the first RF power source 110-1 and the second RF power of the second RF power source 110-2 may be applied to the process chamber 120 through the bottom electrode 125.

The shower head 126 may be located in an upper portion of the process chamber 120. The shower head 126 may be connected to a process gas source through a gas inlet and a gas supply pipe, and may include a plurality of spray holes. The shower head 126 may receive process gases from the process gas source through the gas inlet and the gas supply pipe and spray the process gases into the process chamber 120 through the plurality of spray holes.

The antenna 128 may be located in the upper portion of the process chamber 120. For example, the antenna 128 may be located over the shower head 126 and have a coil shape. The antenna 128 may be called a coil antenna based on the coil shape. The antenna 128 may be connected to the third RF power source via the second matcher 130-2. Thus, the third RF power source 110-3 may be applied to the process chamber 120 through the antenna 128.

In an example embodiment, the antenna 128 may include an internal antenna and an external antenna. For example, assuming that FIG. 1 corresponds to a vertical section of the process chamber 120, which is perpendicular to a y-axis, the antenna 128 may be located over the shower head 126 and have a shape of a coil surrounding the center of the process chamber 120 on an x-y plane. In FIG. 1, two squares in the center may correspond to the internal antenna, and two squares on both outer edges may correspond to the external antenna.

Although not shown, the plasma processing system 100 may include at least one RF sensor. The at least one RF sensor may be located at an output terminal of the RF power source unit 110 or an input terminal or an output terminal of the impedance matcher 130 to measure RF power transmitted to the process chamber 120 and/or an impedance of the process chamber 120. By monitoring a state of the process chamber 120 using the at least one RF sensor, the transmission of RF powers to the process chamber 120 may be effectively managed and adjusted, and thus, a plasma process may be precisely controlled.

The impedance matcher 130 may adjust the impedance and allow RF powers from the RF power source unit 110 to be transmitted to the process chamber 120 at a maximum. For example, the impedance matcher 130 may adjust the impedance such that a complex conjugate condition is satisfied based on the maximum power delivery theory, thereby maximizing the transmission of the RF powers. The impedance matcher 130 may allow the RF power source unit 110 to be driven in an environment of 50Ω to minimize reflected power. The impedance matcher 130 may help to maximize the transmission of the RF powers from the RF power source unit 110 to the process chamber 120.

The impedance matcher 130 may include the first matcher 130-1 and the second matcher 130-2. The first matcher 130-1 may merge the first RF power of the first RF power source 110-1 with the second RF power of the second RF power source 110-2, and transmit merged RF power to the bottom electrode 125. The first matcher 130-1 may adjust the impedance such that the first RF power and/or the second RF power is transmitted to the process chamber 120 at a maximum. The second matcher 130-2 may transmit the third RF power of the third RF power source 110-3 to the antenna 128 and adjust an impedance such that the third RF power is transmitted to the process chamber 120 at a maximum.

In an example embodiment, the impedance matcher 130 may include three matchers corresponding respectively to the first to third RF power sources 110-1, 110-2, and 110-3. In the embodiments, each of the matchers may adjust an impedance such that a corresponding one of the first to third RF power sources 110-1, 110-2, and 110-3 transmits RF power to the process chamber 120 at a maximum.

In the plasma processing system 100 of the present example embodiment, the first to third RF power sources 110-1, 110-2, and 110-3 may apply the first to third RF powers having respectively different frequencies to the process chamber 120, and thus, a phase-sensitivity issue caused by the use of the same frequency may be avoided. Accordingly, a calibration process for phase synchronization between frequencies of two RF powers (e.g., the first frequency of the first RF power and the third frequency of the third RF power) applied to the process chamber 120 may be omitted. For reference, the calibration process for phase synchronization between frequencies may be performed by the impedance matcher 130 or performed by an additional frequency adjusting unit configured to adjust frequencies of the first to third RF power sources 110-1, 110-2, and 110-3. The phase-sensitivity issue will be described in further detail below with reference to FIGS. 6 and 7.

RF powers of the RF power source unit 110 may be transmitted to the process chamber 120 through a transmission line 140. The transmission line 140 may be located between the impedance matcher 130 and the process chamber 120. The transmission line 140 may be located between the RF power source unit 110 and the impedance matcher 130. The transmission line 140 may be implemented as, e.g., a coax cable, an RF strap, or an RF rod. In general, since the coax cable has a low attenuation to a high frequency, the coax cable may be suitable for broadband transmission and cause low leakage due to the presence of an external conductor. Thus, the coax cable may be used as a transmission cable configured to deliver an RF power having a high frequency of, e.g., several MHz to several tens of MHz. The RF strap may include a strap conductor, a ground housing, and an insulator. The strap conductor may have a strap-like shape extending in one direction, and the ground housing may surround the strap conductor in the form of a circular tube with the insulator therebetween. The RF rod may be structurally different from the RF strap in that the RF rod includes a rod conductor having a cylindrical shape instead of the strap conductor. The RF strap or the RF rod may also be used to deliver an RF power having a high frequency of, e.g., several MHz to several tens of MHz.

The plasma processing system 100 of the present example embodiment may apply RF powers to the process chamber 120 through the RF power source unit 110 to generate plasma. The RF power source unit 110 may include the first to third RF power sources 110-1, 110-2, and 110-3, and may apply RF powers having different frequencies to the process chamber 120, and thus, a distribution of plasma in the process chamber 120 may be improved. Accordingly, the etching of the substrate 1000 on which a plasma process is to be performed may be uniformly performed.

In the plasma processing system 100 of the present example embodiment, the first RF power of the first RF power source 110-1 may have a first frequency of about 12.88 MHz to about 14.25 MHz, the second RF power of the second RF power source 110-2 may have a second frequency of about 1.8 MHz to about 2.17 MHz, and the third RF power of the third RF power source 110-3 may have a third frequency of about 12.88 MHz to about 14.24 MHz. In a plasma process using the plasma processing system 100 of the present example embodiment, the second, third, and first RF powers of which the second, third, and first frequencies are increased in this order may be applied to the process chamber 120.

In the plasma processing system 100 of the present example embodiment, the RF power of the first to third RF power sources 110-1, 110-2, and 110-3 has different frequencies. Thus, a phase-sensitivity issue caused by the use of the same frequency may be avoided during the plasma process. By making the first frequency of the first RF power of the first RF power source 110-1 different from the third frequency of the third RF power of the third RF power source 110-3, a calibration process for phase synchronization between the first frequency and the third frequency may be omitted.

The plasma processing system 100 of the present example embodiment may be an etching apparatus configured to etch the substrate 1000 using plasma. In another example embodiment, the plasma processing system 100 may be a deposition apparatus configured to deposit a material film on the substrate 1000 using plasma, or a cleaning apparatus configured to clean the resultant structure on the substrate 1000 by using plasma after an etching process or a deposition process. The plasma processing system 100 of the present example embodiment may uniformly perform etching, deposition, and/or cleaning processes on the substrate 1000 on which a plasma process is to be performed, by improving the plasma distribution. The plasma processing system 100 of the present example embodiment may be used for an etching process or, e.g., a deposition process or a cleaning process.

Figure 2:
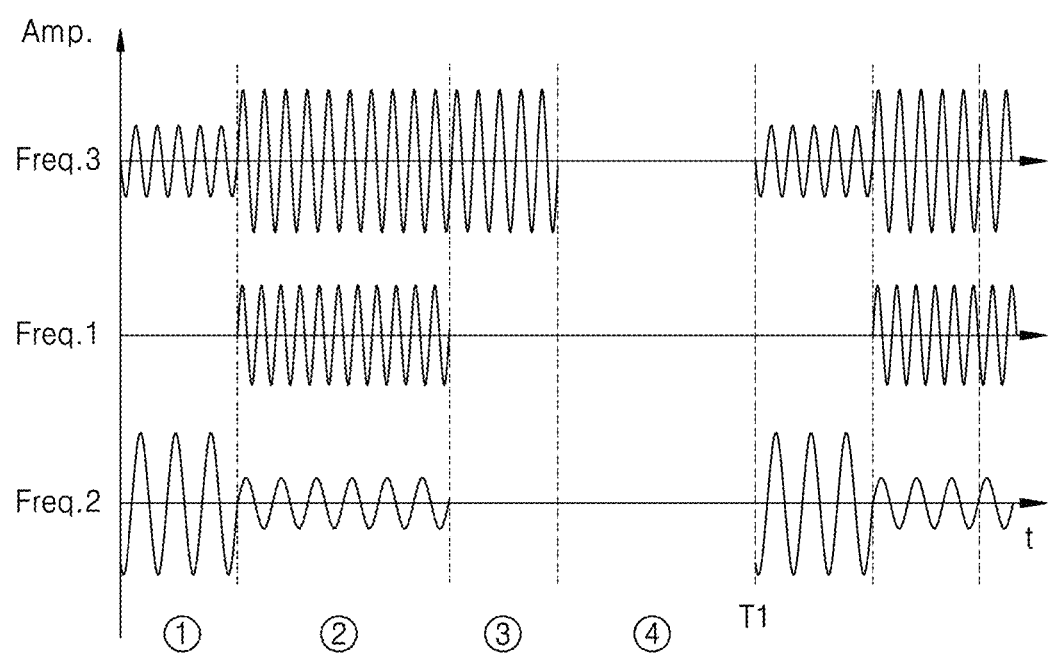
FIG. 2 is a graph showing frequency waveforms of radio-frequency (RF) powers applied by RF power sources in the plasma processing system of FIG. 1.

FIG. 2 is a graph showing frequency waveforms of RF power applied by RF power sources in the plasma processing system of FIG. 1. The abscissa and the ordinate respectively denote time and amplitude (or Amp.), both of which are expressed in arbitrary units indicating only relative magnitudes. FIG. 2 will be described with reference to FIG. 1, and the same descriptions as in FIG. 1 will be omitted or briefly provided.

Referring to FIG. 2, in the plasma processing system 100 of the present example embodiment, a first RF power of a first RF power source 110-1, a second RF power of a second RF power source 110-2, and a third RF power of a third RF power source 110-3 may have different frequencies. For example, a first frequency Freq. 1 of the first RF power may be highest, a second frequency Freq. 2 of the second RF power may be lowest, a third frequency Freq. 3 of the third RF power may be lower than the first frequency Freq. 1 and higher than the second frequency Freq. 2. In FIG. 2, periods of the first frequency Freq. 1, the second frequency Freq. 2, and the third frequency Freq. 3 may be differently indicated to show relative differences among the first frequency Freq. 1, the second frequency Freq. 2, and the third frequency Freq. 3. For example, it can be seen that, in a section ② in which the first to third RF powers are all on, the number of periodic waveforms of the first frequency Freq. 1 may be largest, the number of periodic waveforms of the third frequency Freq. 3 may be second largest, and the number of periodic waveforms of the second frequency Freq. 2 may be smallest.

As described above with reference to FIG. 1, in the plasma processing system 100 of the present example embodiment, the first RF power may be applied through a bottom electrode 125 and have a first frequency Freq. 1 of about 13.96 MHz. The second RF power may be applied through the bottom electrode 125 and have a second frequency Freq. 2 of about 2 MHz. The third RF power may be applied through an antenna 128 and have a third frequency Freq. 3 of about 13.56 MHz. The first to third frequencies Freq. 1, Freq. 2, and Freq. 3 of the first to third RF powers may be varied from the numerical values described above.

For reference, FIG. 2 is a graph of frequency waveforms of voltages or currents on which RF power is based. Accordingly, each actual RF power may correspond to a square of an amplitude of a voltage or current. In FIG. 2, the amplitude indicates not a proportional magnitude but a relative magnitude. Hereinafter, the same concept may be applied to the graphs of FIGS. 3A to 4C.

In the plasma processing system 100 of the present example embodiment, each of the first RF power of the first RF power source 110-1, the second RF power of the second RF power source 110-2, and the third RF power of the third RF power source 110-3 may be applied as a pulse wave type. The pulse wave type may refer to a form in which an RF power having a pulse period is applied in an on-section and not applied in an off section. For example, when sections ① to ④ are defined as a first pulse period T1 in FIG. 2, in the case of the first frequency Freq. 1 of the first RF power, during the first pulse period T1, the section 2 may be the on-sections, and the sections ③, ④, and ① may be the off-sections. In the case of the second frequency Freq. 2 of the second RF power, during the first pulse period T1, the sections ① and ② may be the on-sections, and the sections ③ and ④ may be the off-sections. In the case of the third frequency Freq. 3 of the third RF power, during the first pulse period T1, the sections ① to ③ may be the on-sections, and the section may be the off-section.

For reference, the RF power may be a continuous wave type or a pulse wave type. The continuous wave type may refer to a form in which RF power is continuously applied without distinguishing an on-section from an off-section. In the pulse wave type, the first to third RF powers may be time-divided differently from each other and applied, such that the first to third RF powers may have respectively different on-sections and off-sections.

In an example embodiment, the third RF power may be a main factor in the generation of plasma, and the on-section of each of the first and second RF powers may be included in the on-section of the third RF power such that, when the third RF power is in the on state, each of the first and second RF powers may be applied in the on state.

In the plasma processing system 100 of the present example embodiment, each of the second and third RF powers may be applied at different power levels in the on-sections. For example, in the second frequency Freq. 2 of the second RF power, the sections ① and ② may be on-sections, and the second RF power may have a higher power level in the section ① than in the section ② section. In the third frequency Freq. 3 of the third RF power, the sections ① to ③ may be on-sections, and the third RF power may have a lower power level in the section ① than in the sections ② and ③. A high power level may be, e.g., twice to three times higher than a low power level, but a difference between the high power level and the low power level may be varied from the numerical range described above.

The first frequency Freq. 1 of the first RF power may remain at the same power level during the section ②, which is an on-section. For example, the first RF power may remain at a high power level or a low power level during the section ②. The first RF power may have different power levels in the on-sections. Although FIG. 2 illustrates a case in which a power level is divided into two power levels (i.e., a high power level and a low power level), in some example embodiments, the power level may be divided into three or more power levels.

In the plasma processing system 100 of the present example embodiment, the RF power source unit 110 may apply three RF powers having different frequencies to the process chamber 120. The RF power source unit 110 may apply three RF powers as a pulse wave type to the process chamber 120 and, further, apply RF powers having different power levels to the process chamber 120 in each section of the pulse period. As described above, the RF power source unit 110 may apply three RF powers having different frequencies as the pulse wave type at different levels, and thus, a plasma distribution in the process chamber 120 may be improved and a phase-sensitivity issue may be avoided. Thus, the plasma processing system 100 of the present example embodiment may greatly improve an etch rate and an etch profile of the substrate 1000 during a plasma process. The improvement of the plasma distribution may refer to improving uniformity of a plasma density in the process chamber 120, and the improvement of the etch profile may refer to improving uniformity of an etched depth of the substrate 1000.

Figure 3A:
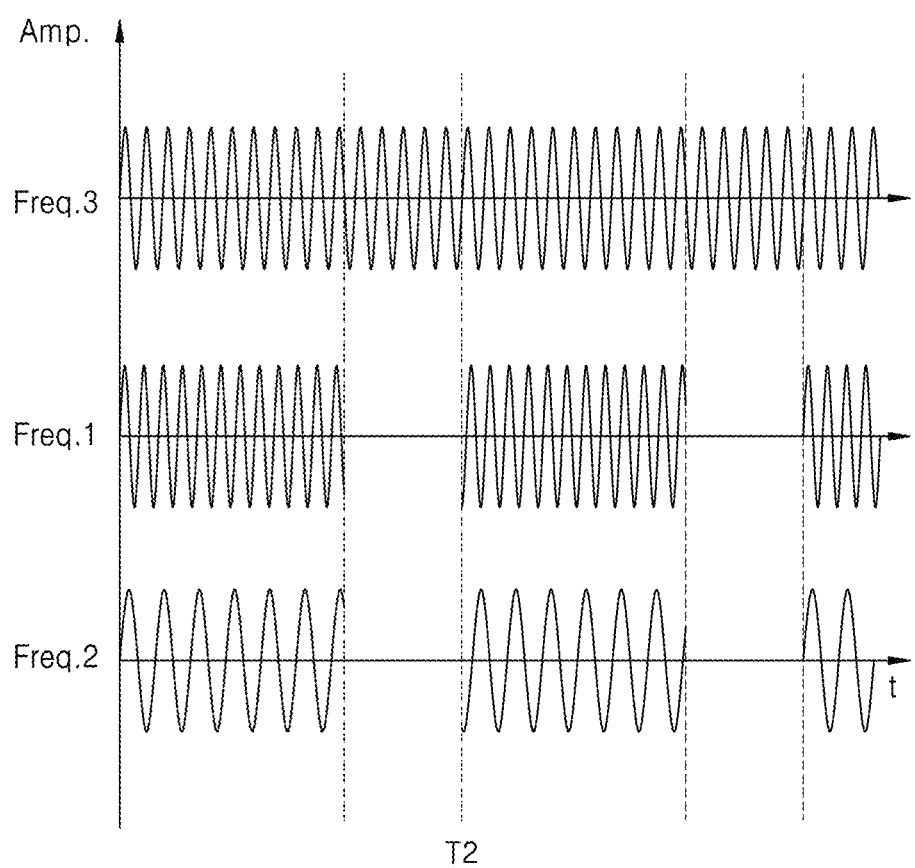
FIGS. 3A to 3C are graphs showing various frequency waveforms of RF powers applied by RF power sources in the plasma processing system 100 of FIG. 1.
Figure 3B:
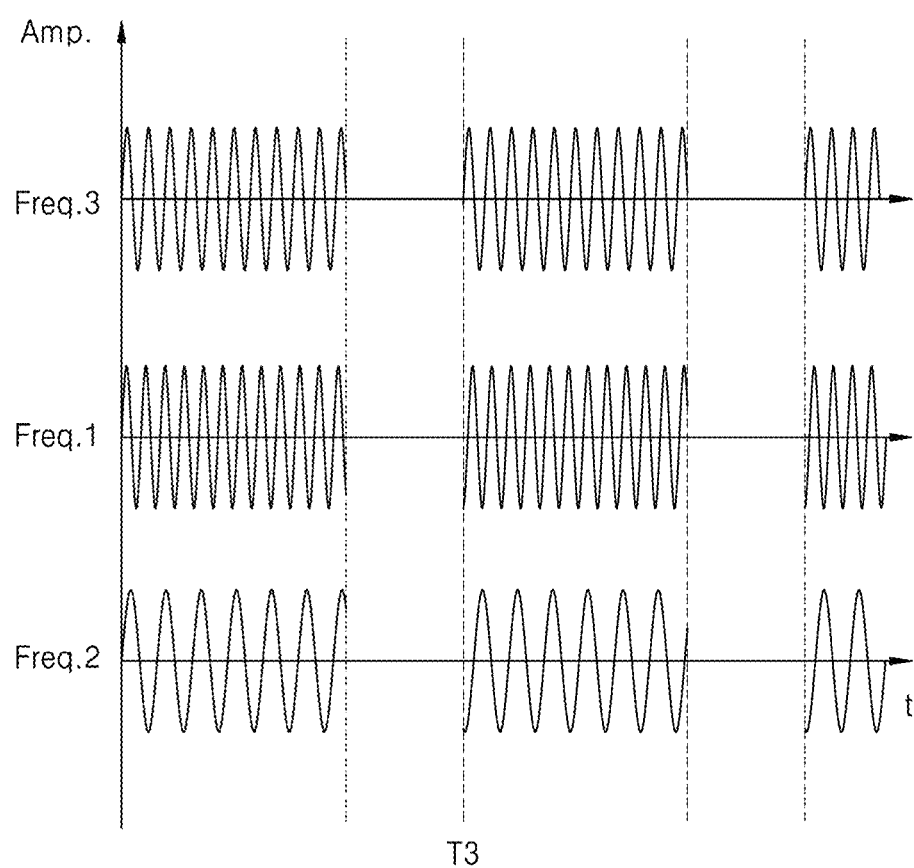
Figure 3C:
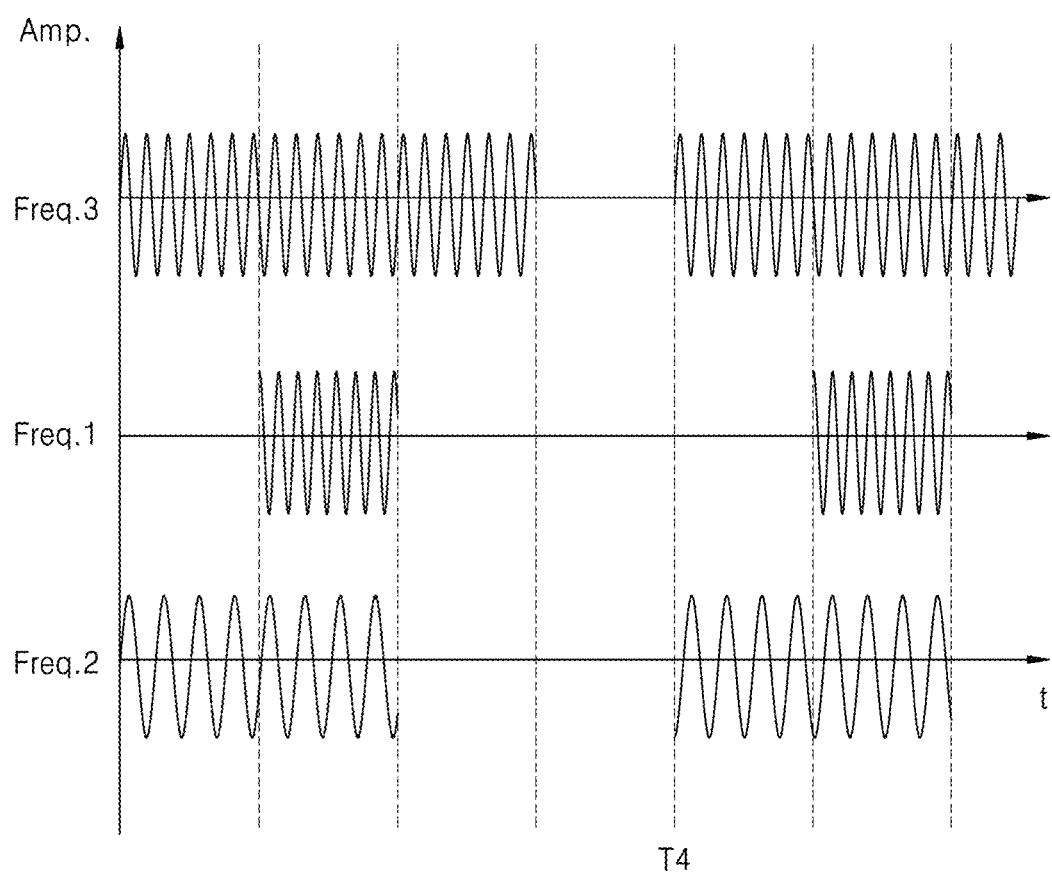

FIGS. 3A to 3C are graphs showing various frequency waveforms of RF powers applied by RF power sources in the plasma processing system 100 of FIG. 1. The abscissa and the ordinate respectively denote time and amplitude (or Amp.), both of which are expressed in arbitrary units indicating only relative magnitudes. FIGS. 3A to 3C will be described with reference to FIG. 1, and the same descriptions as in FIGS. 1 and 2 will be omitted or briefly provided.

Referring to FIG. 3A, in the plasma processing system 100 of the present example embodiment, the first RF power of the first RF power source 110-1, the second RF power of the second RF power source 110-2, and the third RF power of the third RF power source 110-3 may have respectively different frequencies, as shown in FIG. 2. The first frequency Freq. 1 of the first RF power may be highest, the second frequency Freq. 2 of the second RF power may be lowest, and the third frequency Freq. 3 of the third RF power may be lower than the first frequency Freq. 1 and higher than the second frequency Freq. 2.

In the present example embodiment, each of the first and second RF powers may be applied as a pulse wave type (in which each of the first and second RF powers have an on-section and off-section, and may alternately remain in an on state and an off state), and the third RF power may be applied as a continuous wave type (which remains in an on state during a plasma process). In FIG. 3A, the first and second RF powers may have the same second pulse period T2, and an on-section and an off-section of the first RF power may be equal to those of the second RF power. In another example embodiment, the first and second RF powers may have different pulse periods and respectively different on-sections and off-sections.

In an example embodiment, when the third RF power is applied as the continuous wave type, the first and second RF powers may have different pulse periods, whereas, when the third RF power is applied as a pulse wave type, an on-section of each of the first and second RF powers may be included in an on-section of the third RF power such that each of the first and second RF powers may have substantially the same pulse period as the pulse period of the third RF.

In the present example embodiment, each of the first to third RF powers may be applied at the same power level in an on-section. However, as shown in FIG. 2, the first to third RF powers may be applied at respectively different power levels in on-sections.

Referring to FIG. 3B, in the plasma processing system 100 of the present example embodiment, frequency waveforms of RF powers that are shown in FIG. 3B may be different from the frequency waveforms of the RF powers that are shown in FIG. 3A, in that a third RF power is applied as a pulse wave type. For example, in the present example embodiment, the third RF power may have substantially the same pulse period (e.g., a third pulse period T3) as each of a first RF power and a second RF power. An on-section and an off-section of the third RF power may be substantially equal to an on-section and an off-section of each of the first and second RF powers.

Moreover, under conditions that each of the first and second RF powers has the same pulse period as the third RF power and an on-section of each of the first and second RF powers is included in an on-section of the third RF power, the first to third RF powers may have respectively different on-sections and off-sections.

Referring to FIG. 3C, in the plasma processing system 100 of the present example embodiment, frequency waveforms of RF powers that are shown in FIG. 3C may be different from the frequency waveforms of the RF powers that are shown in FIG. 3B, in that a first RF power, a second RF power, and a third RF power are each applied as a pulse wave type and have respectively different on-sections and off-sections. For example, in the present example embodiment, the first to third RF powers may have substantially the same pulse period, i.e., a fourth pulse period T4. The first to third RF powers may have respectively different on-sections and off-sections. The on-section of each of the first and second RF powers may be included in the on-section of the third RF power, as shown. Under the conditions that the on-section of each of the first and second RF powers is included in the on-section of the third RF power, the first and second RF powers may have respectively different on-sections and off-sections.

Figure 4A:
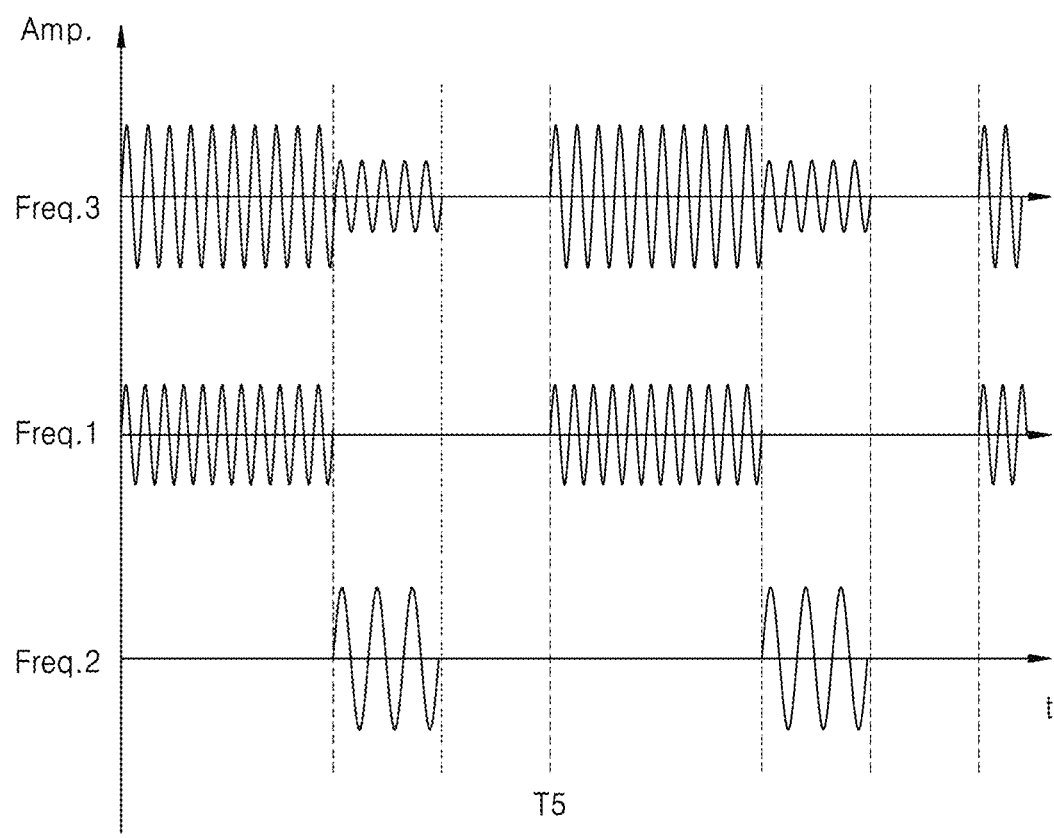
FIGS. 4A to 4C are graphs showing various frequency waveforms of RF powers applied by RF power sources in the plasma processing system of FIG. 1.
Figure 4B:
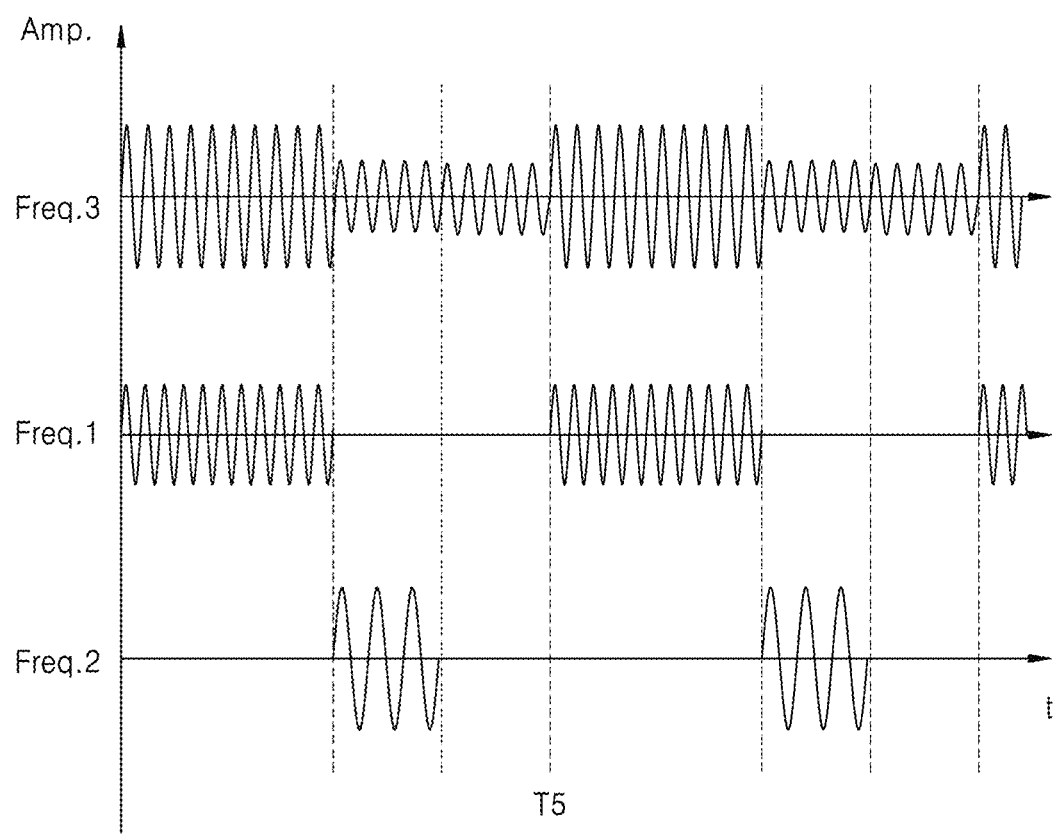
Figure 4C:
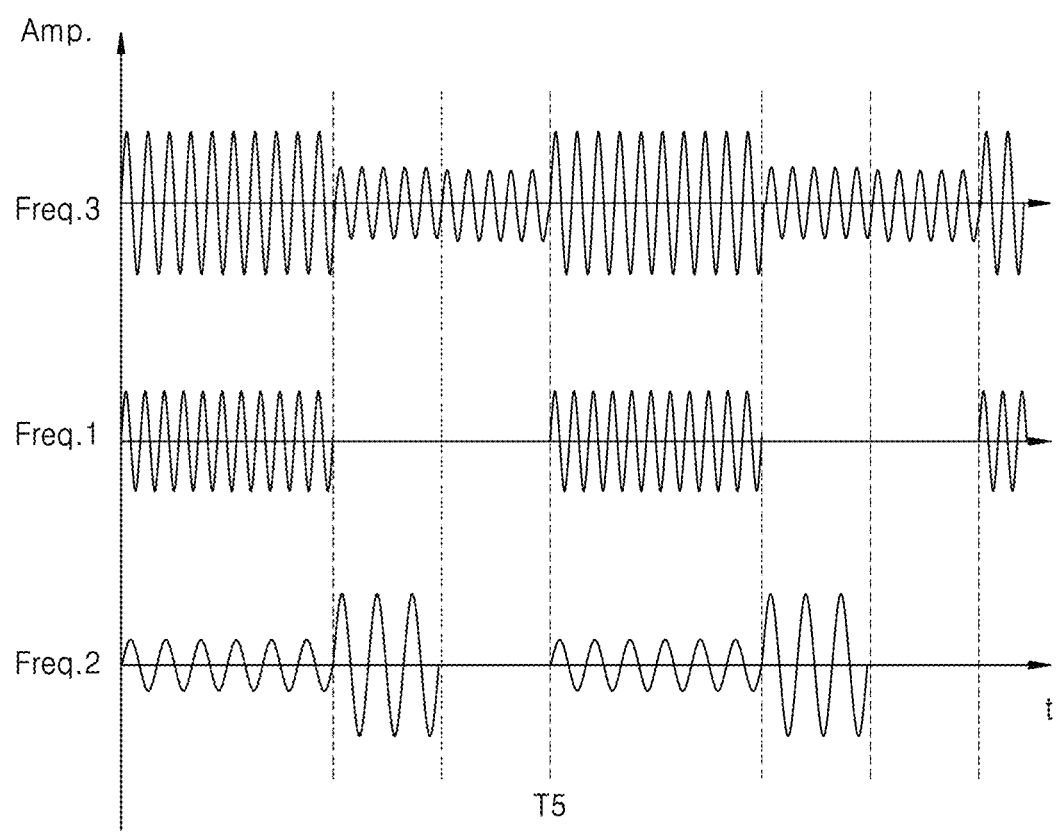

FIGS. 4A to 4C are graphs showing various frequency waveforms of RF powers applied by RF power sources in the plasma processing system 100 of FIG. 1. The abscissa and the ordinate respectively denote time and amplitude (or Amp.), both of which are expressed in arbitrary units indicating only relative magnitudes. FIGS. 4A to 4C will be described with reference to FIG. 1, and the same descriptions as in FIGS. 1 to 3C will be omitted or briefly provided.

Referring to FIG. 4A, in the plasma processing system 100 of the present example embodiment, frequency waveforms of RF powers that are shown in FIG. 4A may be different from the frequency waveforms of RF powers that are shown in FIG. 2, in that a first RF power, a second RF power, and a third RF power are each applied as a pulse wave type, and only the third RF power is applied at different power levels in an on-section.

In the present example embodiment, the first to third RF powers may have substantially the same pulse period, i.e., a fifth pulse period T5. The first and second RF powers may be applied at the same power level in an on-section. In contrast, the third RF power may be applied at different levels in the on-section, such that the third RF power may be applied at two power levels, e.g., a high power level and a low power level, in the on-section.

The on-section of the first RF power may start at the same point in time as the on-section of the third RF power, and end at a point in time when the third RF power is changed to a low power level. The on-section of the second RF power may start at a point in time when the on-section of the first RF power ends, and end at a point in time when the on-section of the third RF power ends. The on-section of the second RF power may be maintained in a section in which the third RF power is at a low power level.

Referring to FIG. 4B, in the plasma processing system 100 of the present example embodiment, frequency waveforms of RF powers that are shown in FIG. 4B may be different from the frequency waveforms of RF powers that are shown in FIG. 4A, in that a third RF power is applied as a continuous wave type at different power levels. In the present example embodiment, a first RF power and a second RF power may have substantially the same pulse period, i.e., a fifth pulse period T5. In contrast, the third RF power may be applied as a continuous wave type without an off-section. Although the third RF power is not applied as a pulse wave type, the third RF power may have a similar periodicity to a pulse wave in that the third RF power remains at a high power level in a partial section and remains at a low power level in another partial section.

An on-section of the first RF power may start at a point in time when the third RF power is changed to the high power level, and may end at a point in time when the third RF power is changed from the high power level to a low power level. Also, an on-section of the second RF power may start at a point in time when the on-section of the first RF power ends, and may end before the third RF power is changed to a high power level.

Referring to FIG. 4C, in the plasma processing system 100 of the present example embodiment, frequency waveforms of RF powers that are shown in FIG. 4C may be different from the frequency waveforms of RF powers that are shown in FIG. 4B, in that a third RF power is applied as a continuous wave type at different power levels and a second RF power is applied at different power levels. In the present example embodiment, a first RF power and a second RF power may have substantially the same pulse period, i.e., a fifth pulse period T5. In contrast, the third RF power may be applied as a continuous wave type without an off-section. Although the third RF power is not applied as a pulse wave type, the third RF power may have a similar periodicity to a pulse wave between a high power level and a low power level.

The second RF power may be applied at different power levels in an on-section. For example, an on-section of the second RF power may start at the same point as an on-section of the first RF power, and the second RF power may remain at a low power level and be changed to a high power level at a point in time when the on-section of the first RF power ends. The second RF power may end before the third RF power is changed to a high power level.

Similarly to the graph of FIG. 4B, the on-section of the first RF power may start at a point in time when the third RF power is changed to the high power level, and end at a point in time when the third RF power is changed to a low power level.

The application of the first to third RF powers as various wave types (e.g., the continuous wave type or the pulse wave type) and the application of the first to third RF powers at the same power level or two different power levels have been described above with reference to FIGS. 2 to 4C. However, the waveforms and power levels of the first to third RF powers may be varied, e.g., under a condition that the on-section of each of the first and second RF powers is included in the on-section of the third RF power, the first to third RF powers may have various waveforms and various power levels to improve an etch rate and an etch profile of the substrate 1000.

Figure 5A:
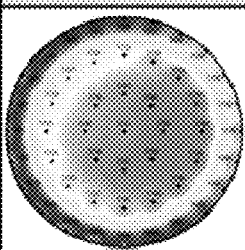
FIGS. 5A and 5B are images of wafers etched using a plasma process in a plasma processing system of a comparative example and a plasma processing system according to an example embodiment.
Figure 5A:
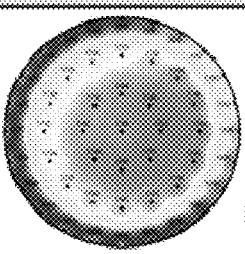
Figure 5A:
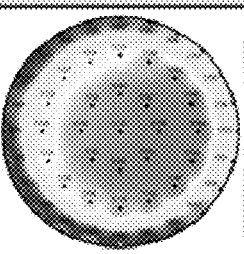
Figure 5B:
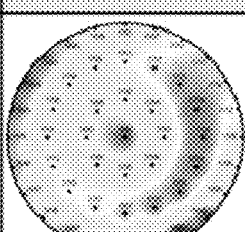

FIGS. 5A and 5B are images of wafers etched using a plasma process in a plasma processing system of a comparative example and a plasma processing system according to an example embodiment, respectively.

In FIG. 5A, a first frequency of a first RF power and a third frequency of a third RF power may have substantially the same value of about 13.56 MHz. In FIG. 5B, the first frequency of the first RF power and the third frequency of the third RF power may have different values of about 13.96 MHz and about 13.56 MHz, respectively. The first RF power may be applied to a process chamber 120 through a bottom electrode 125, while the third RF power may be applied to the process chamber 120 through an antenna 128.

Referring to FIG. 5A, in the plasma processing system of the comparative example, after a plasma process, measured values (i.e., Avg. (distribution)) of three substrates were about 1713 Å/min (2.2%), about 1714 Å/min (2.4%), and about 1714 Å/min (2.4%). Here, each of the first numerical values 1713 Å/min, 1714 Å/min, and 1714 Å/min may denote the average etched depth per minute of a corresponding substrate. Also, each of the second numerical values in parentheses may denote a distribution or uniformity in etched depth as a value calculated by a numerical expression of (Max−Min)/mean*100. Here, Max denotes the maximum etched depth, Min denotes the minimum etched depth, and mean denotes the mean etched depth. The distribution or uniformity in etched depth may correspond to a distribution or uniformity of plasma in the process chamber 120. Thus, in the plasma processing system of the comparative example, it can be seen that the distribution of etched depth or plasma was about 2.3% on the average.

Referring to FIG. 5B, in the plasma processing system according to the present example embodiment, after a plasma process, measured values (i.e., Avg. (distribution)) of three substrates were about 1705 Å/min (1.2%), about 1694 Å/min (1.4%), and about 1700 Å/min (1.6%). Thus, in the plasma processing system according to the present example embodiment, it can be seen that the distribution of etched depth or plasma was about 1.4% on the average. It can be inferred that the distribution of etched depth or plasma was greatly improved as compared to the distribution (about 2.3%) of the etched depth or plasma of the plasma processing system of the comparative example.

Figure 6:
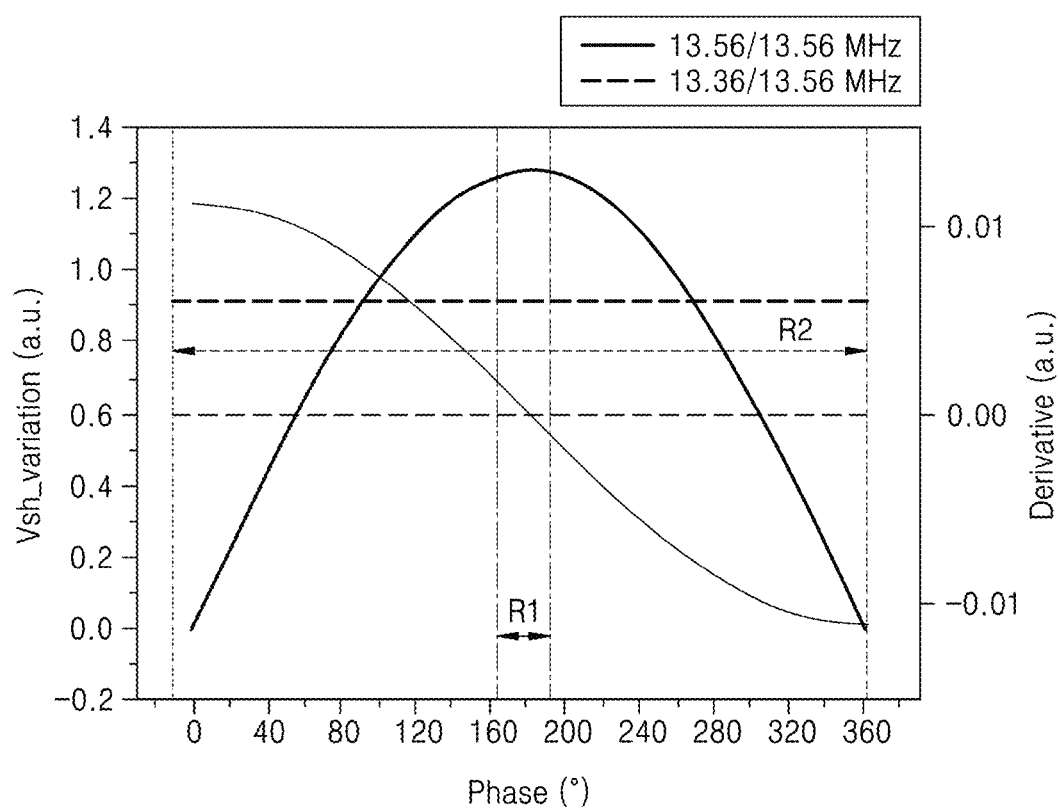
FIG. 6 is a graph showing phase sensitivities of a plasma processing system of a comparative example and a plasma processing system according to an example embodiment.

FIG. 6 is a graph showing phase sensitivities of a plasma processing system of a comparative example and a plasma processing system according to an example embodiment.

In FIG. 6, the abscissa denotes a phase difference between two frequencies (e.g., a first frequency of a first RF power and a third frequency of a third RF power), which is expressed in degrees)(°. A left ordinate denotes a variation in voltage Vsh applied between plasma and a substrate, which is expressed in arbitrary units, and a right ordinate denotes a derivative of the variation in voltage Vsh, which is expressed in arbitrary units. Here, in the plasma processing system of the comparative example, the first and third frequencies of the first and third RF powers may have substantially the same value of about 13.56 MHz. In the plasma processing system of the present example embodiment, the first and third frequencies of the first and third RF powers may have different values of about 13.56 MHz and about 13.36 MHz, respectively. The first RF power may be applied to a process chamber 120 through a bottom electrode 125, while the third RF power may be applied to a process chamber 120 through an antenna 128.

Referring to FIG. 6, in the plasma processing system of the comparative example, a variation in voltage Vsh may be large according to a phase difference as indicated by a thick solid line, and a derivative may also keep changing between 0.01 and −0.01 according to the phase difference as indicated by a thin solid line. Thus, it can be seen that the derivative may become almost 0 and the variation in voltage Vsh may be small and stable only in a stable zone R1 near a phase difference of 180°. Here, a phenomenon where a variation in voltage Vsh becomes large according to a phase difference due to the application of two RF powers having the same frequency may be interpreted as 'a high phase sensitivity' or 'a phase-sensitivity issue'.

Thus, when the first and third RF powers that have the same frequency are applied in the plasma processing system of the comparative example, a calibration process for phase synchronization may be required such that a phase difference between the first frequency of the first RF power and the third frequency of the third RF power becomes about 180° and falls within the stable zone R1.

In the plasma processing system of the present example embodiment, there may be little variation in voltage Vsh according to a phase difference as indicated by a thick dotted line, and a derivative may remain almost 0 in a whole section R2 as indicated by a thin dotted line. Thus, it can be seen that the variation in voltage Vsh may be little and stable in the whole section R2 of the phase difference. Thus, the plasma processing system according to the present example embodiment may reduce phase sensitivity or solve a phase-sensitivity issue by applying first RF power and third RF power having different frequencies to the process chamber 120. Thus, when the first and third RF powers are applied to the process chamber 120, a calibration process for synchronizing a phase of a first frequency of the first RF power with a phase of a third frequency of the third RF power may be omitted.

Figure 7:
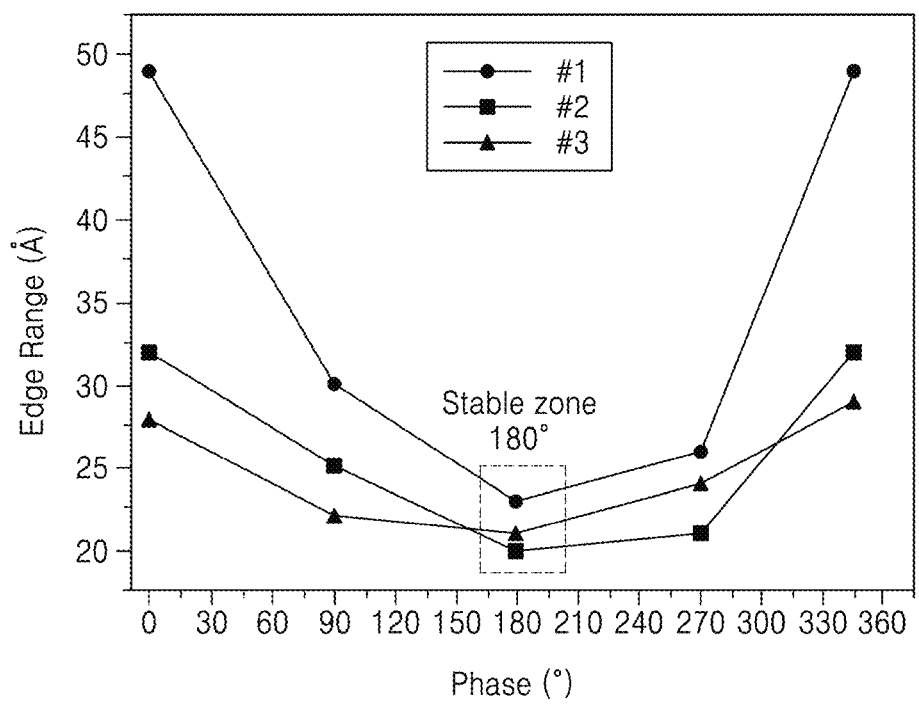
FIG. 7 is a graph showing edge distributions with respect to a phase difference in a plasma processing system of a comparative example.

FIG. 7 is a graph showing edge distributions relative to a phase difference in a plasma processing system of a comparative example.

For a first RF power and third RF power that have substantially the same frequency of about 13.56 MHz in the plasma processing system of the comparative example, FIG.

7 shows curves of edge range relative to phase difference in three substrates. The abscissa denotes a phase difference between two frequencies (e.g., a first frequency of a first RF power and a third frequency of a third RF power), which is expressed in degrees (°). The ordinate denotes an edge range of an etched depth, which is expressed in angstroms (Å). The edge range may refer to a maximum value of a difference between etched depths in an edge portion of a substrate.

Referring to FIG. 7, it can be seen that an edge range may have a low value of about 20 Å to about 25 Å only near a portion having a phase difference of 180°, which corresponds to a stable zone, and have a relatively high value in the remaining zone. Also, it can be seen that the edge range almost two-dimensionally increases in both directions away from the portion having the phase difference of 180°.

The above-described results may be seen to correspond to the graph of the comparative example in FIG. 6. That is, since the variation in voltage Vsh increases in a direction away from the portion having the phase difference of 180°, the edge range may also increase in the direction away from the portion having the phase difference of 180°, which may be seen to be consistent with the measurement result of FIG. 7. Furthermore, it can be inferred that a distribution of the edge portion of the substrate is directly related to phase sensitivity.

With reference to the above, in a plasma processing system according to an example embodiment, the first and third RF powers having different frequencies may be applied to a process chamber to reduce phase sensitivity or address a phase-sensitivity issue, thereby reducing an edge range. Accordingly, a plasma processing system according to an example embodiment may greatly improve a distribution of an edge portion of a substrate 1000 during a plasma process.

A plasma processing system used in FIGS. 5A to 7 may be the plasma processing system 100 of FIG. 1, or may be, e.g., any one of the plasma processing systems 100a, 100b, and 100c described below in connection with FIGS. 8A to 8C.

Figure 8A:
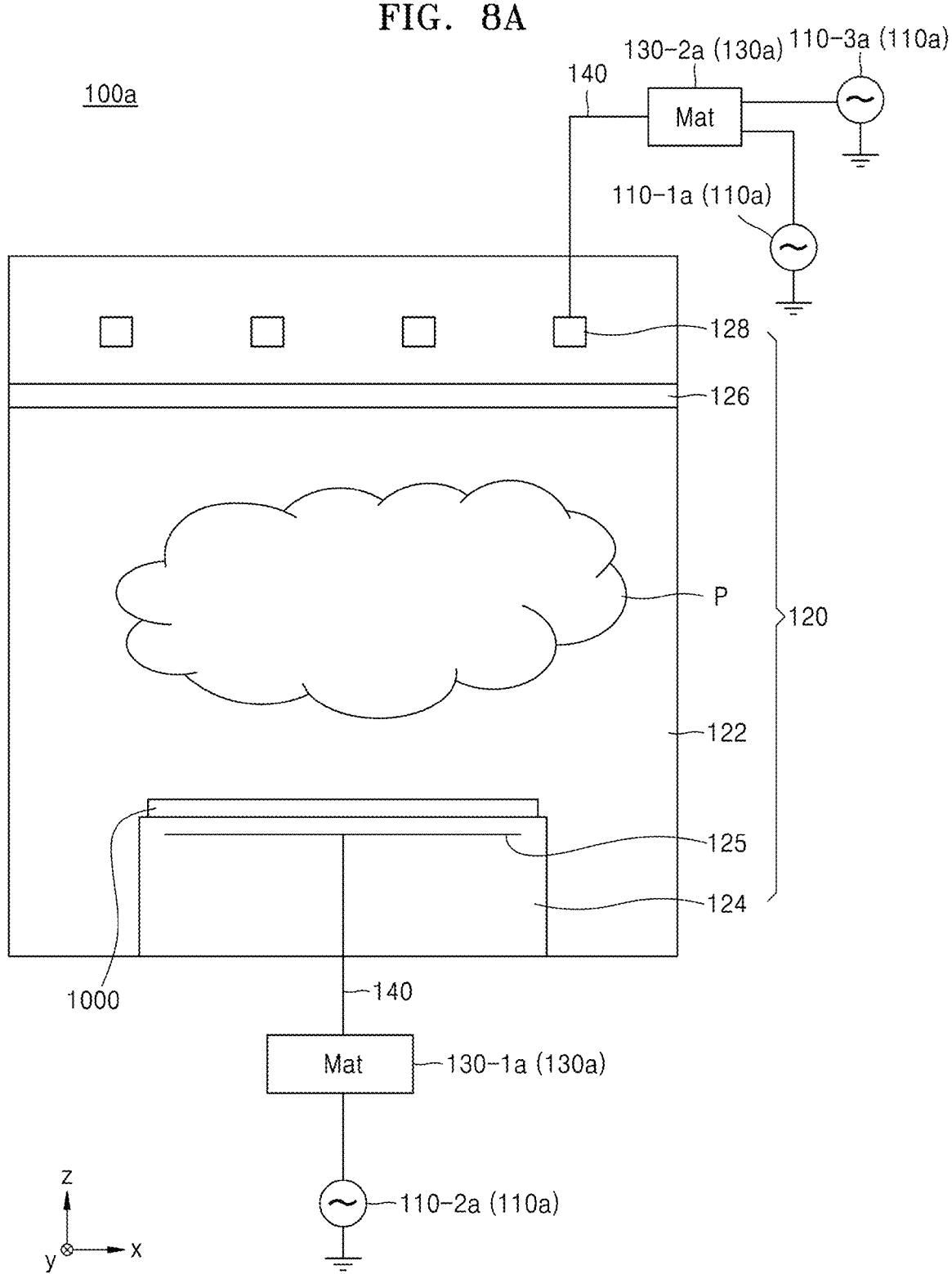
FIGS. 8A to 8C are schematic conceptual diagrams of plasma processing systems according to example embodiments.
Figure 8B:
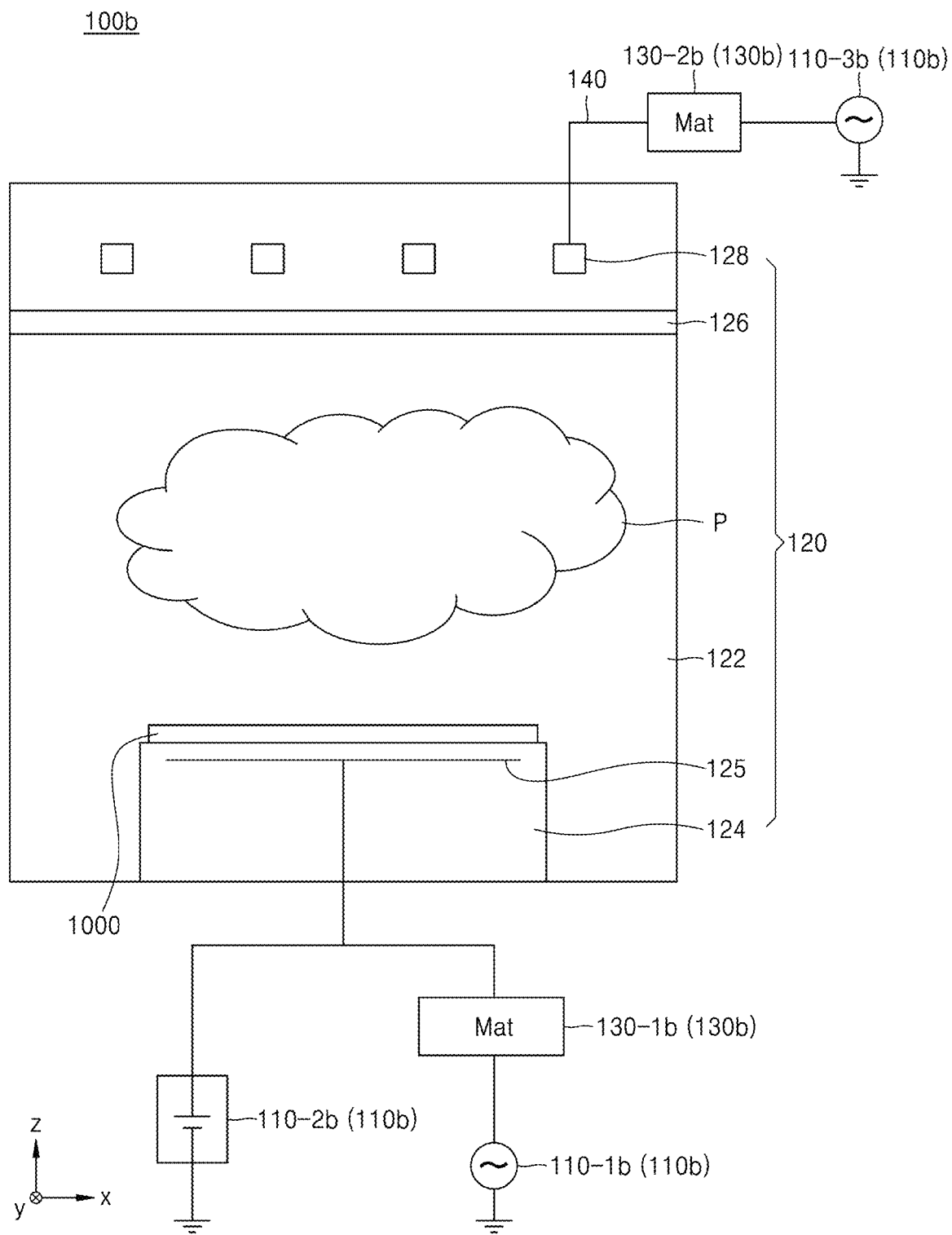
Figure 8C:
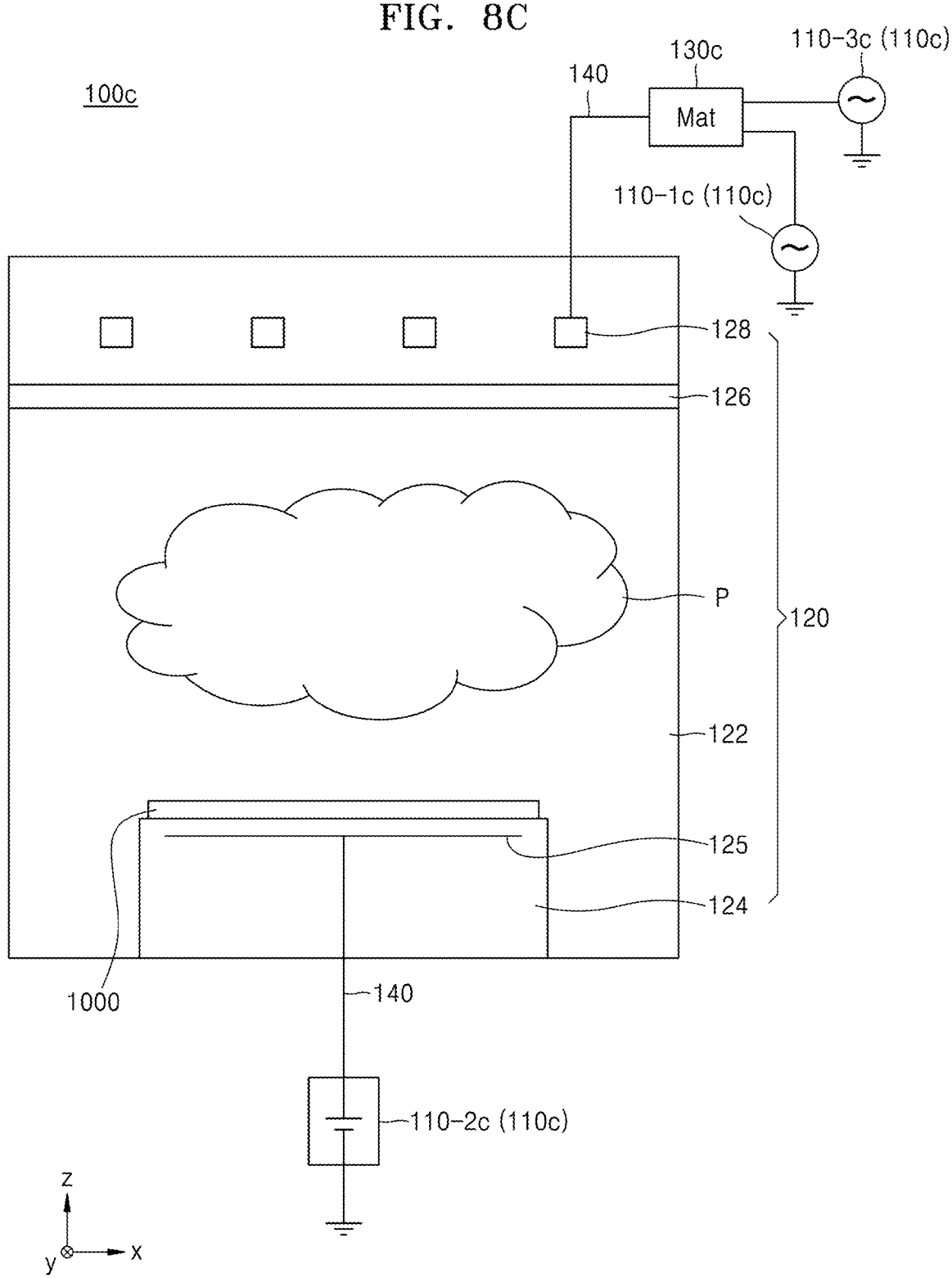

FIGS. 8A to 8C are schematic conceptual diagrams of plasma processing systems according to example embodiments. The same descriptions as in FIGS. 1 to 7 will be omitted or briefly provided.

Referring to FIG. 8A, a plasma processing system 100a of the present example embodiment may have a different connection structure from that of the plasma processing system 100 of FIG. 1. For example, a first RF power source 110-1a and a third RF power source 110-3a of a RF power source unit 110a may be connected to an antenna 128 via an impedance matcher 130a, and a second RF power source 110-2a of the RF power source unit 110a may be connected to a bottom electrode 125 via the impedance matcher 130a. Thus, a first RF power of the first RF power source 110-1a and a third RF power of the third RF power source 110-3a may be applied to a process chamber 120 through the antenna 128. Also, a second RF power of the second RF power source 110-2a may be applied to the process chamber 120 through the bottom electrode 125.

The impedance matcher 130a may include a first matcher 130-1a connected to the second RF power source 110-2a and a second matcher 130-2a connected in common to the first RF power source 110-1a and the third RF power source 110-3a. The first matcher 130-1a may transmit the second RF power to the bottom electrode 125 and adjust an impedance such that the second RF power is transmitted to the process chamber 120 at a maximum. The second matcher 130-2a may merge the first RF power with the third RF power and transmit merged RF power to the antenna 128 and adjust the impedance such that the first RF power and/or the third RF power is transmitted to the process chamber 120 at a maximum.

In an example embodiment, the first RF power source 110-1a may apply the first RF power to the process chamber 120 through an additional top electrode (e.g., a shower head 126) located in an upper portion of the process chamber 120. In this case, an additional matcher may be provided between the first RF power source 110-1a and the top electrode to correspond to the first RF power source 110-1a.

In the plasma processing system 100a of the present example embodiment, frequency sizes, frequency waveforms, and power levels of the first to third RF powers of the first to third RF power sources 110-1a, 110-2a, and 110-3a may be the same as those of the first to third RF powers of the first to third RF power sources 110-1, 110-2, and 110-3, which are included in the plasma processing system 100 described with reference to FIG. 1.

Referring to FIG. 8B, a plasma processing system 100b of the present example embodiment may differ from the plasma processing system 100 of FIG. 1 in that an RF power source unit 110b includes a direct-current (DC) power source 110-2b. For example, the RF power source unit 110b may include a first RF power source 110-1b, the DC power source 110-2b, and a third RF power source 110-3b. The first RF power source 110-1b may be connected to a bottom electrode 125 through a first matcher 130-1b of a impedance matcher 130b, and the DC power source 110-2b may be directly connected to the bottom electrode 125. Thus, first RF power of the first RF power source 110-1b and DC power of the DC power source 110-2b may be applied to a process chamber 120 through the bottom electrode 125. The third RF power source 110-3b may be connected to an antenna 128 via a second matcher 130-2b of the impedance matcher 130b, and thus, third RF power of the third RF power source 110-3b may be applied to the process chamber 120 through the antenna 128. Although FIG. 8B illustrates a case in which the first RF power source 110-1b and the DC power source 110-2b are connected in common to the bottom electrode 125, in some embodiments, the first RF power source 110-1b and the DC power source 110-2b may be separately connected to the bottom electrode 125.

In the plasma processing system 100a of the present example embodiment, frequency sizes, frequency waveforms, and power levels of the first and third RF powers of the first and third RF power sources 110-1b and 110-3b may be the same as those of the first and third RF powers of the first and third RF power sources 110-1 and 110-3, which are included in the plasma processing system 100 described with reference to FIG. 1. The third RF power of the third RF power source 110-3b may generate plasma, and the first RF power of the first RF power source 110-1b may assist and enhance functions of the third RF power of the third RF power source 110-3b and/or the DC power of the DC power source 110-2b.

Moreover, the DC power source 110-2b may differ from the second RF power source 110-2 of the plasma processing system 100 of FIG. 1 in that the DC power source 110-2b generates DC power instead of RF power and applies the DC power to the process chamber 120 such that the DC power source 110-2b may apply the DC power to the process chamber 120 by using a DC voltage or DC current having a predetermined magnitude. Similar to the second RF power, the DC power may supply bias energy to plasma. Thus, the DC power may have a similar power level to the second RF power. For instance, the DC power may range from several hundred W to several tens of thousands of W. For example, in the plasma processing system 100a of the present example embodiment, the DC power may range from several kW to several tens of kW. However, the DC power may be varied from the numerical values described above.

The DC power may be continuously applied or applied as a pulse wave type or a square wave type during a plasma process. The DC power may be applied at one power level or at least two power levels. In addition, the DC power may be applied within an on-section of the third RF power.

Referring to FIG. 8C, a plasma processing system 100c of the present example embodiment may have a different connection structure from that of the plasma processing system 100b of FIG. 8B. For example, a first RF power source 110-1c and a third RF power source 110-3c of an RF power source unit 110c may be connected to an antenna 128 via a impedance matcher 130c, and a DC power source 110-2c of the RF power source unit 110c may be connected to a bottom electrode 125. Thus, first RF power of the first RF power source 110-1c and third RF power of the third RF power source 110-3c may be applied to a process chamber 120 through an antenna 128. Also, DC power of the DC power source 110-2c may be applied to the process chamber 120 through the bottom electrode 125.

In the plasma processing system 100c according to the present example embodiment, frequency sizes, frequency waveforms, and power levels of the first RF power of the first RF power source 110-1c, the DC power of the DC power source 110-2c, and the third RF power of the third RF power source 110-3c may be the same as those of the first RF power of the first RF power source 110-1b, the DC power of the DC power source 110-2b, and the third RF power of the third RF power source 110-3b in the plasma processing system 100b described with reference to FIG. 8B.

Figure 9A:
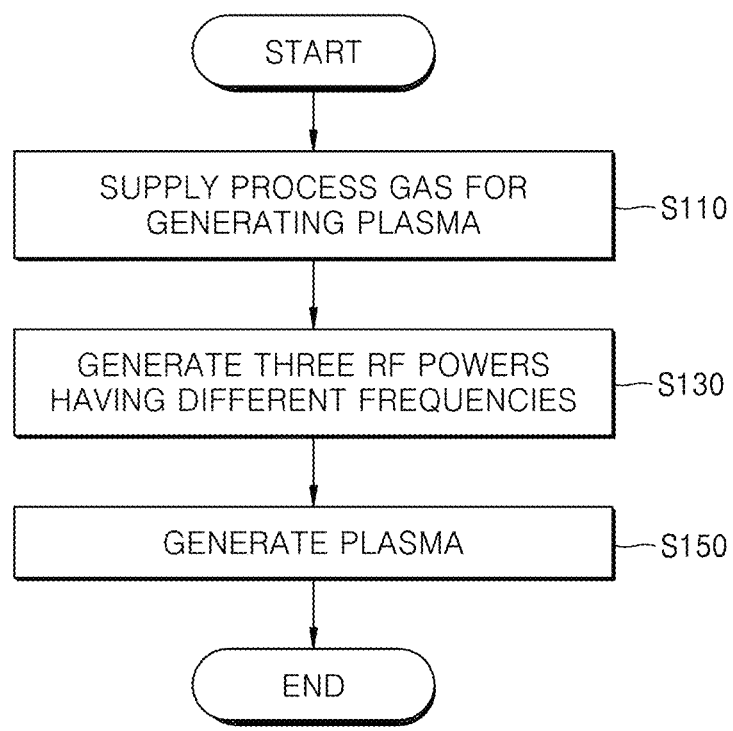
FIGS. 9A and 9B are flowcharts illustrating a method of controlling plasma in a plasma processing system, according to example embodiments.
Figure 9B:
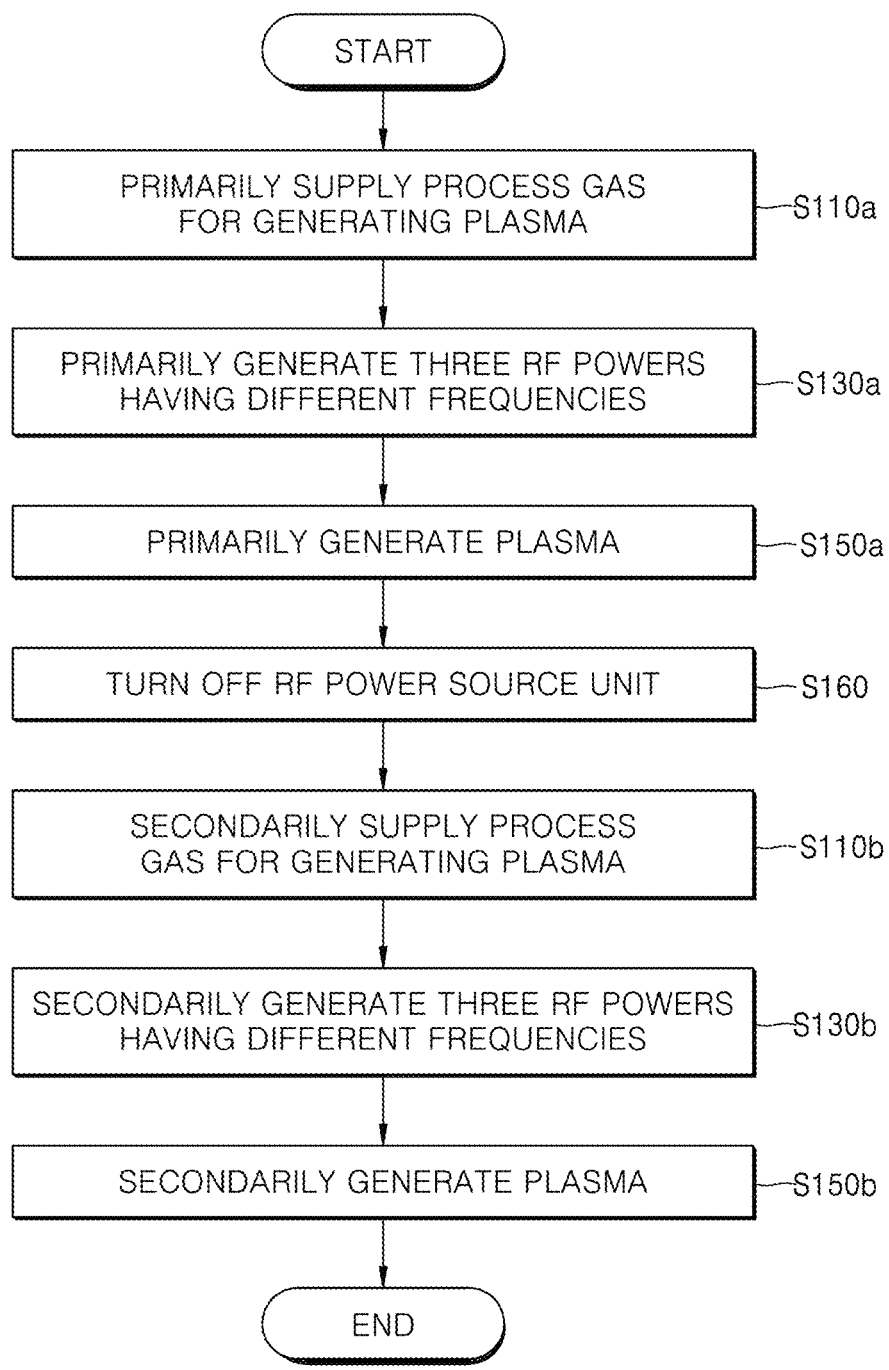

FIGS. 9A and 9B are flowcharts illustrating a method of controlling plasma in a plasma processing system, according to example embodiments. FIGS. 9A and 9B will be described with reference to FIG. 1. The same descriptions as in FIGS. 1 to 8C will be omitted or briefly provided.

Referring to FIG. 9A, a method of controlling plasma of the present example embodiment using the plasma processing system 100 (hereinafter, simply referred to as a 'method of controlling plasma') may include initially supplying a process gas for generating plasma into a process chamber 120 (S110). The process gas may refer to all gases (e.g., a source gas, a reactive gas, a purge gas, and the like) used for a plasma process. The process gas may be transmitted from a process gas source through a gas supply pipe and a gas inlet to a shower head 126 of the process chamber 120, and supplied into the process chamber 120 through spray holes of the shower head 126.

Next, three RF powers having different frequencies may be generated by an RF power source unit 110 (S130). For example, the RF power source unit 110 may include a first RF power source 110-1, a second RF power source 110-2, and a third RF power source 110-3. The first RF power source 110-1 may generate a first RF power having a first frequency, the second RF power source 110-2 may generate a second RF power having a second frequency, and the third RF power source 110-3 may generate a third RF power having a third frequency. The first RF power source 110-1 and the second RF power source 110-2 may be connected to a bottom electrode 125, and the first and second RF powers may be applied to the process chamber 120 through the bottom electrode 125. The third RF power source 110-3 may be connected to an antenna 128, and the third RF power may be applied to the process chamber 120 through the antenna 128.

Frequency sizes, frequency waveforms, and power levels of the first to third RF powers may be the same as in the plasma processing system 100 described above with reference to FIG. 1. Thus, in the method of controlling plasma according to the present example embodiment, a highest frequency may be exhibited by the first RF power, followed by the third RF power and finally the second RF power.

Subsequently, plasma may be generated in the process chamber 120 by applying the first to third RF powers to the process chamber 120 (S150). The first, second, and third RF powers may be applied to the process chamber 120 after an impedance is adjusted by a corresponding one of the first and second matchers 130-1 and 130-2 of the impedance matcher 130. Although FIG. 9A illustrates a case in which the generation of the first to third RF powers is distinguished from the application of the first to third RF powers to the process chamber 120, the generation of the first to third RF powers may be performed substantially simultaneously with the application of the first to third RF powers to the process chamber 120. In an example embodiment, the supplying of the process gas into the process chamber 120 may be performed substantially simultaneously with or after the application of the first to third RF powers to the process chamber 120 depending on a type of process gas.

In addition, although not shown in the flowchart of FIG. 9A, a process of electrostatically chucking the substrate 1000 to the electrostatic chuck 124 may be performed when a plasma process starts, and a process of dechucking the substrate 1000 (i.e., releasing the electrostatic chucking of the substrate 1000) may be performed after the plasma process. The chucking and dechucking processes may be performed in the plasma process and may be included in the method of controlling plasma, which is described below in connection with FIG. 9B, and a method of manufacturing the semiconductor device, which is described below in connection with FIGS. 10A and 10B.

In the method of controlling plasma according to the present example embodiment, the second, third, and first RF powers (of which the second, third, and first frequencies are increased in this order) may be applied as a continuous wave type or a pulse wave type to the process chamber 120. The first and second RF powers may be applied to the process chamber 120 in such a manner that an on-section of each of the first and second RF powers is included in an on-section of the third RF power. Thus, in the method of controlling plasma according to the present example embodiment, the first to third RF power sources 110-1, 110-2, and 110-3 may apply RF power having different frequencies to the process chamber 120. Thus, a plasma distribution in the process chamber 120 may be improved, and a phase-sensitivity issue caused by the use of the same frequency may be avoided.

Referring to FIG. 9B, a method of controlling plasma according to the present example embodiment may be different from the method of controlling plasma, which is described with reference to FIG. 9A, in that plasma is generated twice. For example, the method of controlling plasma according to the present example embodiment may include sequentially performing operation S110a in which a process gas for generating plasma is primarily supplied into a process chamber 120, operation S130a in which the RF power source unit 110 primarily generates three RF powers having different frequencies, and operation S150a in which plasma is primarily generated in the process chamber 120 by applying three RF powers having different frequencies to the process chamber 120. Operations S110a, S130a, and S150a may respectively correspond to operation S110 in which the process gas for generating plasma is supplied into the process chamber 120, operation S130 in which three RF powers having different frequencies are generated by the RF power source unit 110, and operation S150 in which plasma is generated in the process chamber 120 by applying three RF powers having different frequencies to the process chamber 120, in the method of controlling plasma, which is shown in FIG. 9A. Thus, detailed descriptions of operations S110a, S130a, and S150a will be omitted.

Subsequently, the RF power source unit 110 may be turned off (S160). That is, the three RF powers having different frequencies may be entirely off. By entirely turning off the RF powers, operation S150a in which plasma is primarily generated may be temporarily, physically, and chemically separated from the next operation of secondarily generating plasma. A time period for which the RF power source unit 110 is turned off may be several seconds to tens of seconds. However, the time period for which the RF power source unit 110 is turned off may be varied from the time range described above. In an example embodiment, in operation S160 in which the RF power source unit 110 is turned off, or separately from operation S160, gases included in the process chamber 120 may be exhausted through a gas outlet to the outside.

Thereafter, operations S110b, S130b, and S150b may be sequentially performed. In operation S110b, a process gas for generating plasma may be secondarily supplied into the process chamber 120. In operation S130b, three RF powers having different frequencies may be secondarily generated by the RF power source unit 110. In operation S150b, plasma may be secondarily generated in the process chamber 120 by applying three RF powers having different frequencies to the process chamber 120. Similarly, operations S110b, S130b, and S150b may be respectively the same as operation S110 in which the process gas for generating plasma is supplied into the process chamber 120, operation S130 in which three RF powers having different frequencies are generated by the RF power source unit 110, and operation S150 in which plasma is generated in the process chamber 120 by applying three RF powers having different frequencies to the process chamber 120, in the method of controlling plasma, which is described above with reference to FIG. 9A.

However, process gases of different types may be supplied at different doses under different pressures in operation S110a in which the process gas for generating plasma is primarily supplied into the process chamber 120 and operation S110b in which the process gas for generating plasma is secondarily supplied into the process chamber 120. Also, a pulse wave type of RF powers generated in operation S130a in which the RF powers are primarily generated may be different from a pulse wave type of RF powers generated in operation S130b in which the RF powers are secondarily generated. Thus, characteristics and functions of plasma generated in operation S150a in which plasma is primarily generated may be different from those of plasma generated in operation S150b in which plasma is secondarily generated.

In an example embodiment, when a plasma process is assumed to be a process of etching the substrate 1000, the primarily generated plasma may set an initial etching shape of the substrate 1000. The secondarily generated plasma may be used to perform a main etching process on the substrate 1000. Pulse wave types of RF power will be described in further detail below with reference to FIGS. 10A and 10B.

In the method of controlling plasma according to the present example embodiment, plasma may be generated twice, and thus, the substrate 1000 on which the plasma process is to be performed may be etched uniformly to form a required pattern. Thus, an etch rate and etch profile of the substrate 1000 may be greatly improved.

FIGS. 10A to 10D are graphs showing pulse waves of RF power used to generate plasma in the method of controlling plasma, which is shown in FIG. 9B. Although each RF power has a sine wave shape as shown in FIGS. 2 to 4C, each RF power is illustrated as a pulse wave type having a pulse period in FIGS. 10 to 10D for brevity. Percent (%) is indicated at tops of the graphs of FIGS. 10A to 10D to show a duty ratio (or duty cycle). FIGS. 10A to 10D will be described with reference to FIGS. 1 and 9B, and the same descriptions as in FIG. 9B will be omitted or briefly provided.

Figure 10A:
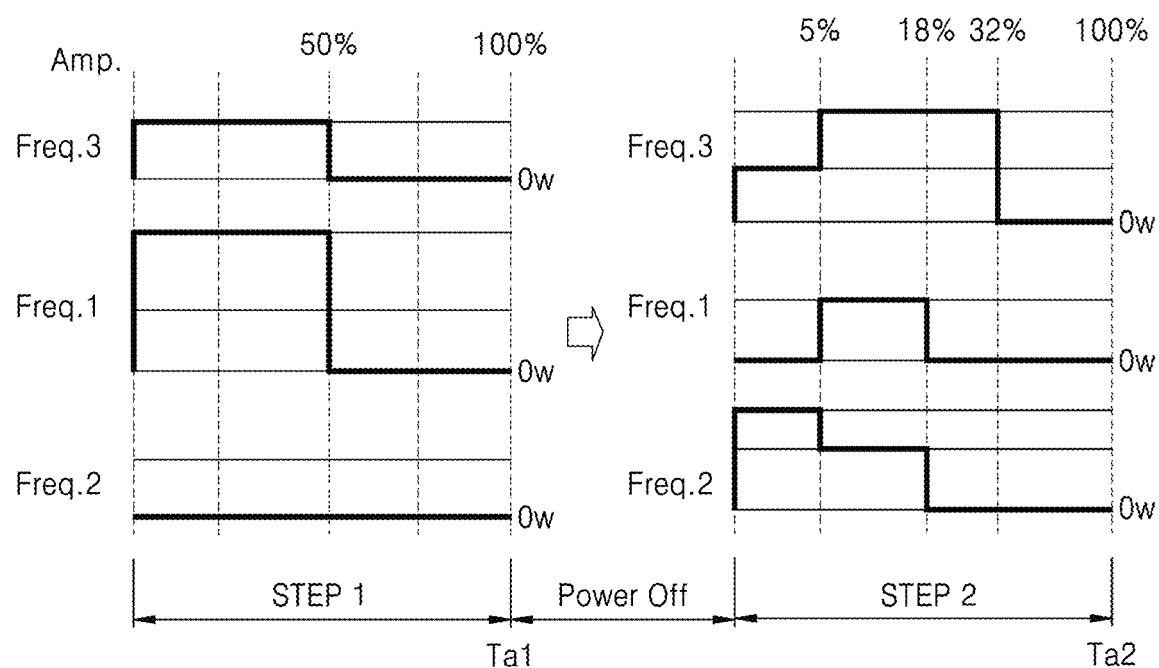
FIGS. 10A to 10D are graphs showing pulse waves of RF powers for generating plasma in the method of controlling plasma, which is shown in FIG. 9B.

Referring to FIG. 10A, in the method of controlling plasma according to the present example embodiment, pulse waves in a section STEP 1 may correspond to pulse waves of RF powers applied during a process of primarily generating plasma, and pulse waves in a section STEP 2 may correspond to pulse waves of RF powers applied during a process of secondarily generating plasma. For reference, a section Power Off may be a section in which RF powers are turned off between the process of primarily generating plasma and the process of secondarily generating plasma. The section Power Off may correspond to operation S160 of FIG. 9B, in which the RF power source unit 110 is turned off.

Each of the section STEP 1 and the section STEP 2 may be maintained for several tens of seconds to several tens of minutes. A corresponding pulse period of each RF power may be repeated thousands to hundreds of thousands of times in each of the section STEP 1 and the section STEP 2. For example, the section STEP 1 may be maintained for about 1 minute, and a pulse period Ta1 may range from several thousands of microseconds (µs) to several tens of thousands of microseconds (p). The section STEP 2 may be maintained for about 10 minutes, and a pulse period Ta2 may range from several hundreds of µs to several thousands of µs. Duration times of the section STEP 1 and the section STEP 2 and the pulse periods Ta1 and Ta2 may be varied from the numerical values described above.

For brevity, only one pulse period is illustrated in each of the section STEP 1 and the section STEP 2 of FIG. 10A. Similarly, only one pulse period is illustrated in each of a section STEP 1 and a section STEP 2 of FIGS. 10B to 10D for brevity. Pulse periods Ta1 and Tb1 of the section STEP 1 may be equal to or different from each other. Pulse periods Ta2, Tb2, Tc2, and Td2 of the section STEP 2 may be all equal to each other or at least one of the pulse periods Ta2, Tb2, Tc2, and Td2 may be different from the others thereof.

In the method of controlling plasma according to the present example embodiment, a frequency size of each RF power may be the same as described above with reference to FIG. 1. For example, a first frequency Freq. 1 of a first RF power may range from about 12.88 MHz to about 14.25 MHz, a second frequency Freq. 2 of a second RF power may range from about 1.8 MHz to about 2.17 MHz, and a third frequency Freq. 3 of a third RF power may range from about 12.88 MHz to about 14.24 MHz. For example, the first frequency Freq. 1 of the first RF power may be about 13.96 MHz, the second frequency Freq. 2 of the second RF power may be about 2.0 MHz, and the third frequency Freq. 3 of the third RF power may be about 13.56 MHz. However, a frequency size of each RF power may be varied from the numerical values described above.

In the method of controlling plasma according to the present example embodiment, in the section STEP 1, the second RF power may remain in an off state, and each of the first and third RF powers may be put into an on/off state at a predetermined duty ratio of, e.g., 50%. Also, each of the first and third RF powers may remain in an on state at the same power level. In the section STEP 2, each of the first to third RF powers may be put into an on/off state at a predetermined duty ratio. In addition, at least one of the first to third RF powers may remain in an on state at different levels. For instance, each of the second and third RF powers may remain in an on state at two power levels.

Furthermore, on-off conditions of RF powers, which are described with reference to FIGS. 2 and 4C, may be applied to the section STEP 1 and the section STEP 2. That is, in each of the section STEP 1 and the section STEP 2, an on-section of each of the first and second RF powers may be included in an on-section of the third RF power. Hereinafter, the same conditions may also be applied to pulse waves of RF powers that are shown in FIGS. 10B to 10D.

Figure 10B:
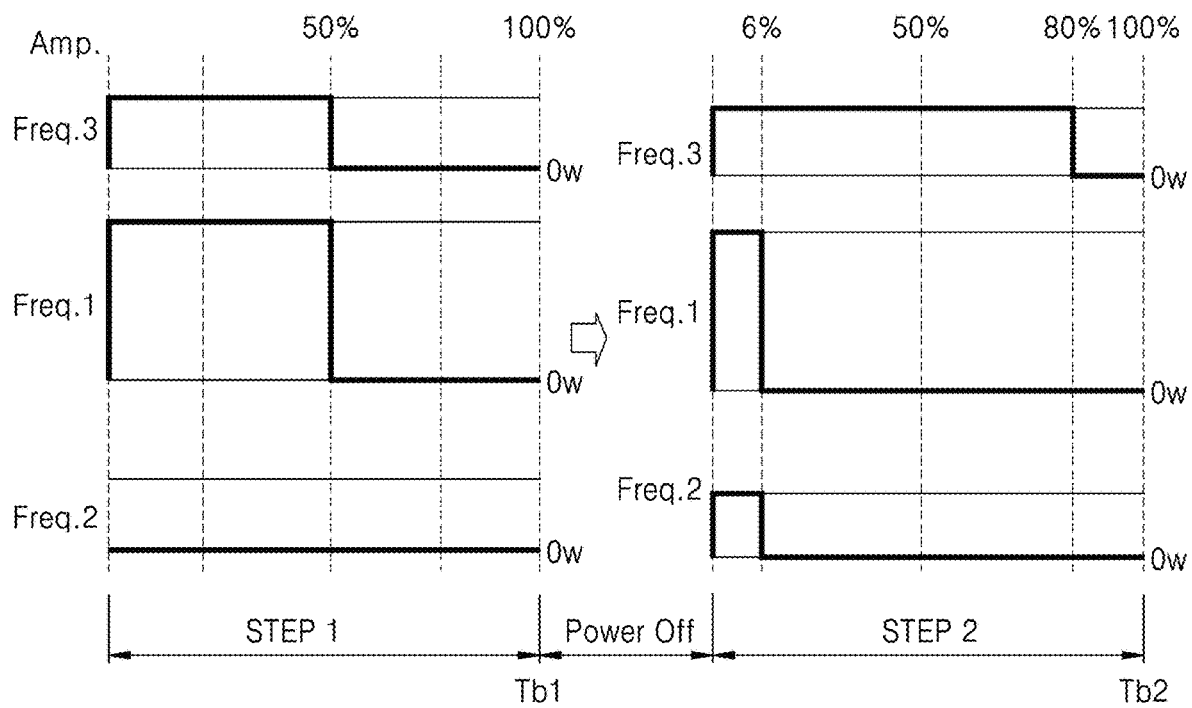

Referring to FIG. 10B, in the method of controlling plasma according to the present example embodiment, in a section STEP 1, a first RF power, a second RF power, and a third RF power may have substantially the same pulse wave types as in the section STEP 1 of FIG. 10A. However, in the section STEP 2, the first to third RF powers may have different duty ratios and power levels from in the section STEP 2 of FIG. 10A. For example, each of the first to third RF powers may remain in an on state at the same power level.

Figure 10C:
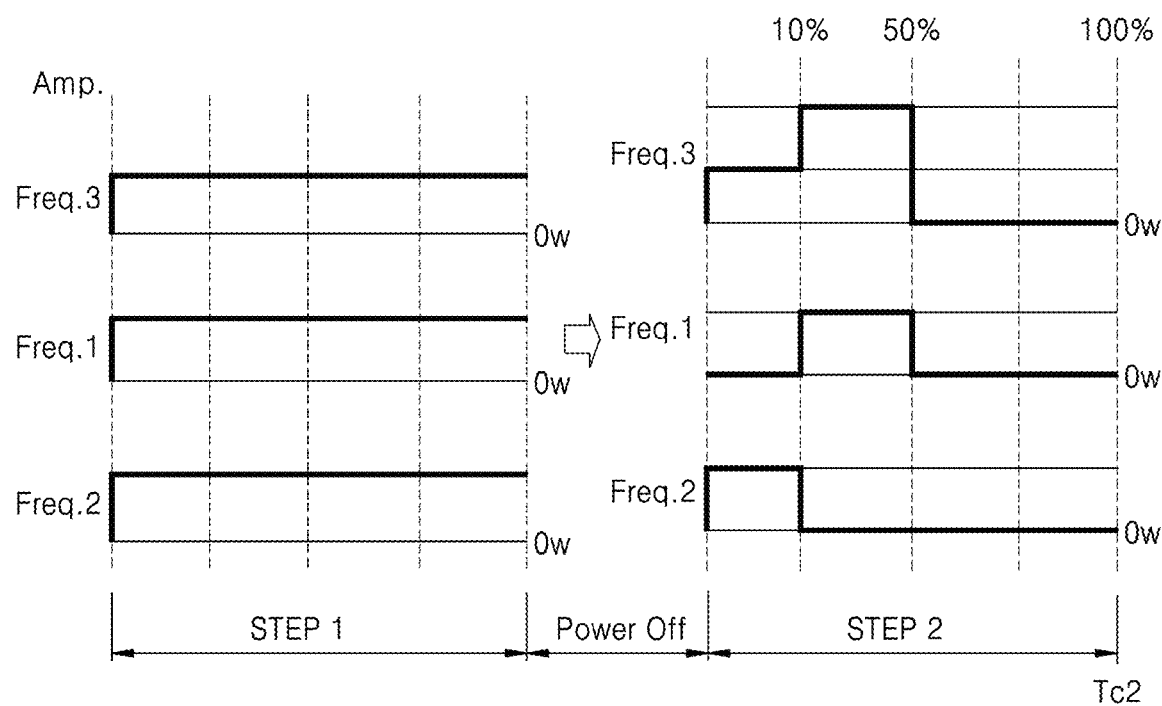

Referring to FIG. 10C, in the method of controlling plasma according to the present example embodiment, a section STEP 1 may be different from the sections STEP 1 of FIGS. 10A and 10B in that each of a first RF power, a second RF power, and a third RF power is applied as a continuous wave type at a duty ratio of 100% (i.e., without an off-section). In the section STEP 1 of FIG. 10C, since there is no periodic repetition of an on-off section, a pulse period may not be defined. Also, a pulse period may not be defined in the section STEP 1 of FIG. 10D. In a section STEP 2, each of the first to third RF powers may be put into an on/off state at a predetermined duty ratio, and at least one of the first to third RF powers may remain in an on state at different power levels. For example, the third RF power may remain in the on state at two power levels.

Figure 10D:
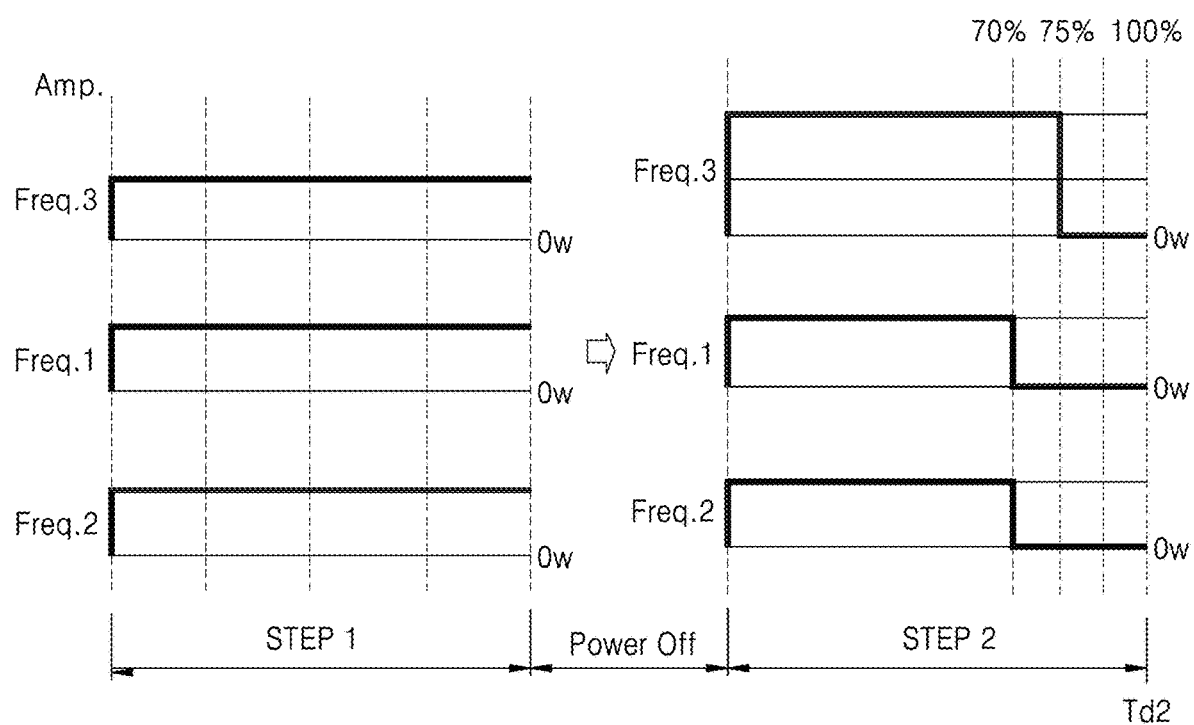

Referring to FIG. 10D, in the method of controlling plasma according to the present example embodiment, the section STEP 1 may be substantially the same as the section STEP 1 of FIG. 10C in that each of a first RF power, a second RF power, and a third RF power is applied as a continuous wave type at a duty ratio of 100% (i.e., without an off-section). In a section STEP 2, each of the first to third RF powers may be put into an on/off state at a predetermined duty ratio and remain in an on state at the same power level.

Various pulse wave types and power levels have been described above with reference to FIGS. 10A to 10D. However, pulse wave types and power levels according to example embodiments may be varied, e.g., under conditions that an on-section of each of the first and second RF powers is included in an on-section of the third RF power, various pulse wave types and various power levels may be applied to improve an etch rate and etch profile of the substrate 1000.

Figure 11A:
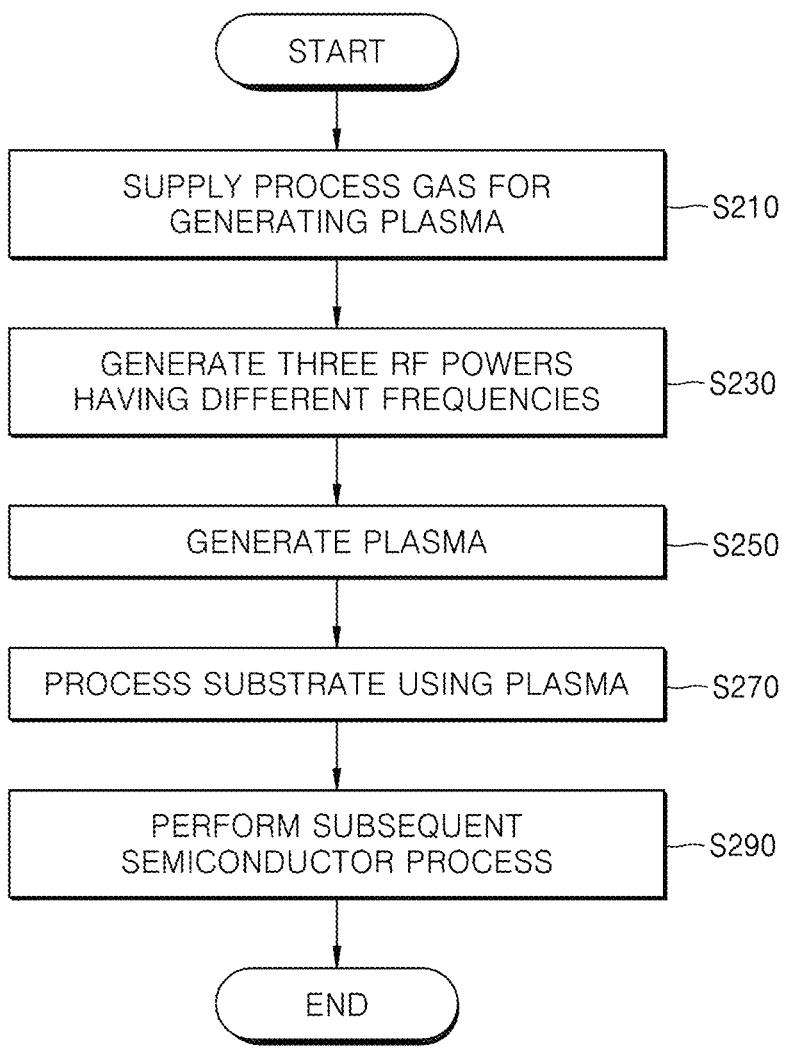
FIGS. 11A and 11B are flowcharts illustrating methods of manufacturing semiconductor device, the methods including a method of controlling plasma, according to example embodiments.
Figure 11B:
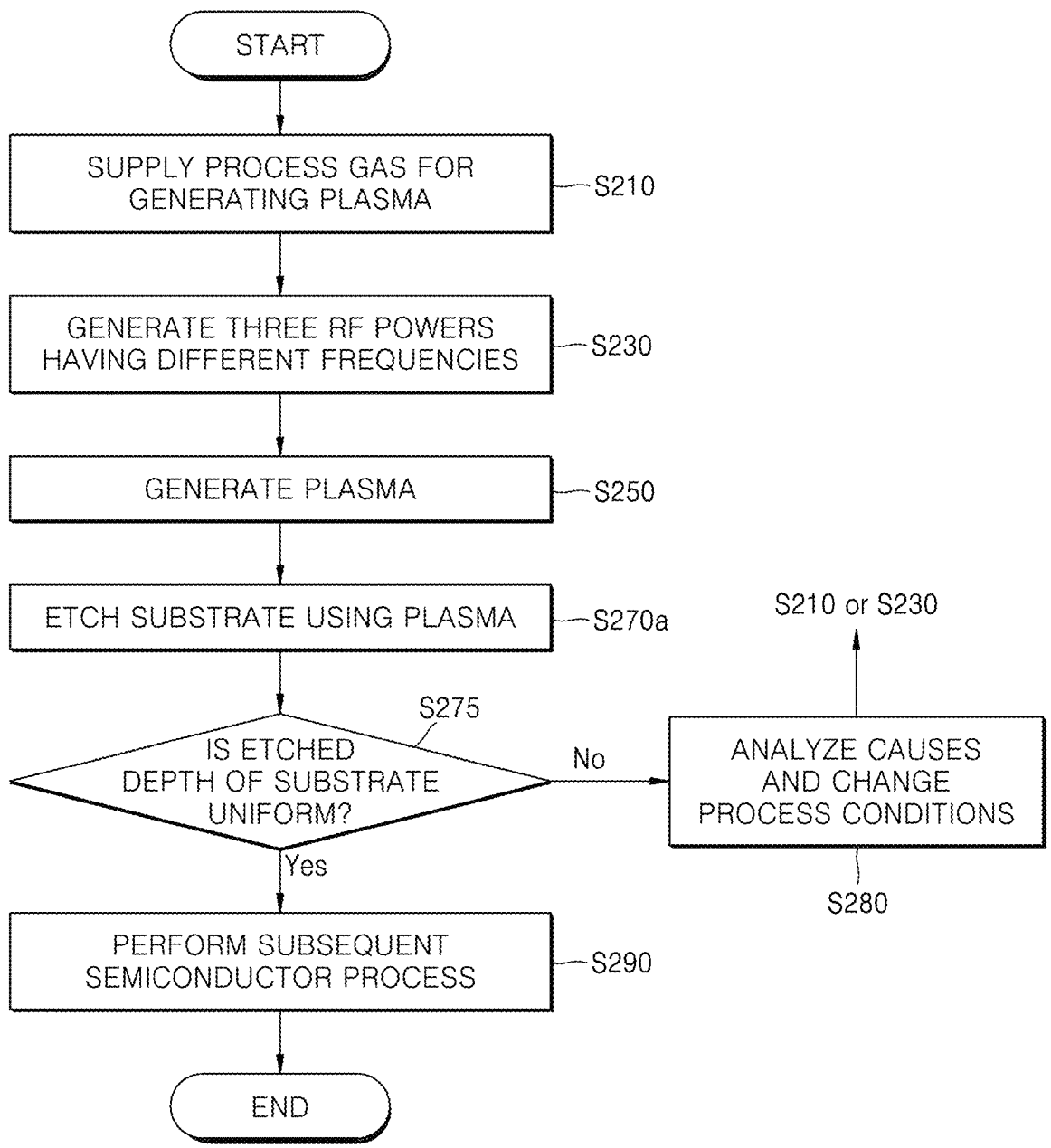

FIGS. 11A and 11B are flowcharts illustrating methods of manufacturing semiconductor device, which include a method of controlling plasma, according to example embodiments. FIGS. 11A and 11B will be described with reference to FIG. 1, and the same descriptions as in FIGS. 9A and 9B will be omitted or briefly provided.

Referring to FIG. 11A, a method of manufacturing the semiconductor device, which includes the method of controlling plasma, according to the present example embodiment (hereinafter, simply referred to as a 'method of manufacturing a semiconductor device') may include sequentially performing operation S210 in which a process gas for generating plasma is supplied into a process chamber 120, operation S230 in which three RF powers having different frequencies are generated, and operation S250 in which plasma is generated. Operations S210 to S250 may be the same as operations S110 to S150 described above with reference to FIG. 9A.

Subsequently, a plasma process may be performed on the substrate 1000 using the generated plasma (S270). The plasma process may include etching, deposition, and cleaning processes on the substrate 1000 using plasma.

After the plasma process is performed on the substrate 1000, subsequent semiconductor processes may be performed on the substrate 1000 (S290). The subsequent semiconductor processes on the substrate 1000 may include various processes. For example, the subsequent semiconductor processes may include a deposition process, an etching process, an ion process, and a cleaning process. Plasma may or may not be used in the subsequent semiconductor processes. The subsequent semiconductor processes may include a singulation process for separating the substrate 1000 into respective semiconductor chips, a test process of testing the semiconductor chips, and a packaging process for packaging the semiconductor chips. By performing the subsequent semiconductor processes on the substrate 1000, the semiconductor device may be completed.

A method of manufacturing a semiconductor device according to an example embodiment may include the method of controlling plasma that is shown in FIG. 9A, and may include the method of controlling plasma that is shown in FIG. 9B. When the method includes the method of controlling plasma that is shown in FIG. 9B, operation S150*a* in which plasma is primarily generated may be followed by primarily processing the substrate 1000 using plasma, and operation S150*b* in which plasma is secondarily generated may be followed by secondarily processing the substrate 1000 using plasma. Thereafter, subsequent semiconductor processes may be performed (S290).

Referring to FIG. 11B, a method of manufacturing the semiconductor device, which includes the method of controlling plasma, according to the present example embodiment (hereinafter, simply referred to as a 'method of manufacturing a semiconductor device') may include sequentially performing operation S210 in which a process gas for generating plasma is supplied into a process chamber 120, operation S230 in which three RF powers having different frequencies are generated, and operation S250 in which plasma is generated.

Subsequently, the substrate 1000 may be etched using the generated plasma (S270*a*).

Next, it may be determined whether an etched depth of the substrate 1000 is uniform (S275). For example, the average and distribution of edged depths of the entire substrate 1000 may be calculated, and it may be determined whether the calculated average and distribution fall within required criteria.

If the etched depth of the substrate 1000 is uniform (Yes), a subsequent semiconductor process may be performed on the substrate 1000 (S290). If the etched depth of the substrate 1000 is not uniform (No), causes of a plasma process may be analyzed and process conditions may be changed (S280). Thereafter, the process may proceed to operation S210 in which the process gas for generating plasma is supplied or operation S230 in which the three RF powers having different frequencies are generated. For example, if there is an error in the type or supplied amount of process gas, the corresponding error may be avoided by changing process conditions, and then the process may proceed to operation S210 in which the process gas for generating plasma is supplied. Otherwise, if there is an error in three frequencies or power levels of RF powers, the corresponding error may be avoided by changing process conditions, and then the process may proceed to operation S230 in which the three RF powers having different frequencies are generated.

In the method of manufacturing the semiconductor device according to the present example embodiment, the first to third RF power sources 110-1, 110-2, and 110-3 may apply RF power having different frequencies to the process chamber 120, and thus a plasma distribution in the process chamber 120 may be improved. Thus, an etch rate and etch profile of the substrate 1000 may be improved during the plasma process. Also, a phase-sensitivity issue caused by the use of the same frequency may be avoided, and thus a calibration process for phase synchronization between two frequencies may be omitted.

Although the process of etching the substrate 1000 using plasma has mainly been described in the method of manufacturing the semiconductor device according to the present example embodiment, the method of manufacturing the semiconductor device according to the present example embodiment may also be applied to a process of depositing a material layer on the substrate 1000 using plasma or a process of cleaning the resultant structure on the substrate 1000 using plasma.

A method of manufacturing the semiconductor device according to an example embodiment may include the method of controlling plasma that is shown in FIG. 9A and may include the method of controlling plasma that is shown in FIG. 9B. In this case, operation S150*a* of primarily generating plasm may be followed by primarily etching the substrate 1000 using plasma, and operation S150*b* of secondarily generating plasma may be followed by secondarily etching the substrate 1000 using plasma. Subsequently, operation S275 of determining whether an etched depth of the substrate 1000 is uniform may be performed.

As described above, embodiments relate to a plasma processing system that may improve control of a plasma distribution in a process chamber, a method of controlling plasma in the plasma processing system, and a method of manufacturing a semiconductor device by using the method of controlling plasma.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of controlling plasma, the method comprising:
primarily supplying a process gas for generating plasma into a process chamber of a plasma processing system;
primarily generating, by a radio-frequency (RF) power source unit, three RF powers having different frequencies;
primarily generating plasma by applying the primarily generated RF powers to the process chamber;
turning off the RF power source unit;
secondarily supplying a process gas for generating plasma into the process chamber;
secondarily generating, by the RF power source unit, three RF powers having different frequencies; and
secondarily generating plasma by applying the secondarily generated RF powers to the process chamber, wherein:
the RF powers include a first RF power having a first frequency, a second RF power having a second frequency, and a third RF power having a third frequency,
the first RF power is applied through a bottom electrode located in an electrostatic chuck located in a lower portion of the process chamber,
the second RF power is applied through the bottom electrode,
the third RF power is applied through an antenna located in an upper portion of the process chamber, and
the first frequency is higher than the second and third frequencies, the second frequency is lower than the first and third frequencies, and the third frequency is between the first and second frequencies.

2. The method as claimed in claim 1, wherein;
the first frequency ranges from higher than 12.88 MHz to about 14.25 MHz,
the second frequency ranges from about 1.8 MHz to about 2.17 MHz, and
the third frequency ranges from about 12.88 MHz to about 14.24 MHz.

3. The method as claimed in claim 1, wherein:
each of the first to third RF powers has at least two power levels and is applied as a continuous wave type power or a pulse wave type power, and
when the third RF power is in an on state, each of the first and second RF powers is applied in an on state.

4. The method as claimed in claim 1, wherein, during the secondarily generating of the RF powers, each of the first RF power, the second RF power, and the third RF power is applied at a different power level and as a different time-division type power, relative to a power level and a time-division type power of a corresponding one of the first RF power, the second RF power, and the third RF power that is applied during the primarily generating of the RF powers.

5. The method as claimed in claim 1, wherein:
during the primarily generating of the RF powers, each of the first to third RF powers is applied at a same power level, and
during the secondarily generating of the RF powers, each of the first to third RF powers is applied at a same power level, or at least one of the first to third RF powers is applied at a different power level.

6. A method of controlling plasma, the method comprising:
supplying a process gas for generating plasma into a process chamber of a plasma processing system;
generating, by a radio-frequency (RF) power source unit, three RF powers having different frequencies; and generating plasma by applying the RF powers to the process chamber, wherein:

the RF powers include a first RF power having a first frequency, a second RF power having a second frequency, and third RF power having a third frequency, the first and second RF powers are applied through a bottom electrode located inside an electrostatic chuck located in a lower portion of the process chamber, the third RF power is applied through an antenna located in an upper portion of the process chamber, the first frequency is adjusted to be higher than the second frequency and the third frequency such that a plasma density uniformity in the process chamber is maximized, the first frequency is controlled to be at least 12.88 MHz to about 14.25 MHz, the second frequency is controlled to be about 1.8 MHz to about 2.17 MHz, and the third frequency is controlled to be about 12.88 MHz to about 14.24 MHz.

7. The method as claimed in claim 6, wherein:

each of the first to third RF powers has at least two power levels, is time-divided, and is applied as a continuous-wave-type power or a pulse-wave-type power, and when the third RF power is in an on state, each of the first and second RF powers is applied in an on state.

8. The method as claimed in claim 6, wherein:

the RF power source unit includes a first RF power source configured to generate the first RF power, a second RF power source configured to generate the second RF power, and a third RF power source configured to generate the third RF power, before the generating of the plasma, the method further includes adjusting an impedance by using an impedance matcher located between the RF power source unit and the process chamber, the impedance matcher includes a first matcher connected in common to the first RF power source and the second RF power source, and a second matcher connected to the third RF power source, the first matcher is configured to merge the first RF power with the second RF power, and transmit merged RF power to the bottom electrode, and a calibration process for phase synchronization between the first frequency and the third frequency is not performed.

9. A method of manufacturing a semiconductor device, the method comprising:

supplying a process gas for generating plasma into a process chamber of a plasma processing system;

generating, by an RF power source unit, three radio-frequency (RF) powers having different frequencies;

generating plasma by applying the RF powers to the process chamber;

processing a substrate using the plasma, the substrate being located on an electrostatic chuck located in a lower portion of the process chamber; and performing a subsequent semiconductor process on the substrate, wherein:

the RF powers include a first RF power having a first frequency, a second RF power having a second frequency, and a third RF power having a third frequency, the first and second RF powers are applied through a first electrode located inside the electrostatic chuck, the third RF power is applied through a second electrode located in an upper portion of the process chamber, the first frequency is adjusted to be higher than the second frequency and the third frequency such that a plasma density uniformity in the process chamber is maximized, the first frequency is controlled to be at least 12.88 MHz to about 14.25 MHz, the second frequency is controlled to be about 1.8 MHz to about 2.17 MHz, and the third frequency is controlled to be about 12.88 MHz to about 14.24 MHz.

10. The method as claimed in claim 9, wherein:

each of the first to third RF powers has at least two power levels and is time-divided as a continuous-wave-type power or a pulse-wave-type power and applied to the process chamber, and when the third RF power is in an on state, each of the first and second RF powers is applied in an on state.

11. The method as claimed in claim 9, wherein:

the RF power source unit includes a first RF power source configured to generate the first RF power, a second RF power source configured to generate the second RF power, and a third RF power source configured to generate the third RF power, before the generating of the plasma, the method further includes adjusting an impedance by using an impedance matcher located between the RF power source unit and the process chamber, wherein the impedance matcher includes a first matcher connected in common to the first RF power source and the second RF power source and a second matcher connected to the third RF power source, the first matcher is configured to merge the first RF power with the second RF power and transmits merged RF power to the first electrode, and a calibration process for phase synchronization between the first frequency and the third frequency is not performed.

12. The method as claimed in claim 9, wherein:

during the processing of the substrate using the plasma, the substrate is etched using the plasma and, during etching of a top surface of the substrate, a plasma density in the process chamber is adjusted by differently adjusting the first, second, and third frequencies of the first to third RF powers, respectively.

* * * * *